United States Patent
Murayama et al.

(10) Patent No.: US 6,696,108 B2
(45) Date of Patent: Feb. 24, 2004

(54) VACUUM PROCESSING METHOD

(75) Inventors: Hitoshi Murayama, Shizuoka (JP); Toshiyasu Shirasuna, Shizuoka (JP); Hiroaki Niino, Shizuoka (JP); Makoto Aoki, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 59 days.

(21) Appl. No.: 10/006,689

(22) Filed: Dec. 10, 2001

(65) Prior Publication Data

US 2002/0160124 A1 Oct. 31, 2002

(30) Foreign Application Priority Data

Dec. 12, 2000 (JP) ........................ 2000-377350
Nov. 26, 2001 (JP) ........................ 2001-359572

(51) Int. Cl.$^7$ ................................ H05H 1/46
(52) U.S. Cl. .................. 427/569; 427/570; 216/71; 118/723 E
(58) Field of Search ................ 427/488, 535, 427/562, 569, 570; 216/67, 71; 438/788, 789; 118/723 E, 723 I

(56) References Cited

U.S. PATENT DOCUMENTS

| | | | |
|---|---|---|---|
| 4,579,618 A | | 4/1986 | Celestino et al. ........... 156/345 |
| 5,129,359 A | | 7/1992 | Takei et al. .................. 118/723 |
| 5,500,256 A | * | 3/1996 | Watabe ........................ 427/579 |
| 5,512,130 A | * | 4/1996 | Barna et al. .................. 216/67 |
| 5,534,070 A | | 7/1996 | Okamura et al. ........... 118/723 |
| 5,571,571 A | * | 11/1996 | Musaka et al. ............. 427/574 |
| 5,582,648 A | | 12/1996 | Katagiri et al. ............. 118/723 |
| 5,656,123 A | * | 8/1997 | Salimian et al. ......... 118/723 E |
| 5,698,062 A | * | 12/1997 | Sakamoto et al. ........ 118/723 E |
| 5,817,534 A | * | 10/1998 | Ye et al. ........................ 216/71 |
| 5,846,885 A | * | 12/1998 | Kamata et al. ............... 216/71 |
| 5,849,372 A | * | 12/1998 | Annaratone et al. ........ 427/569 |
| 5,891,252 A | | 4/1999 | Yokogawa et al. ......... 118/723 |
| 5,985,375 A | * | 11/1999 | Donohoe et al. ............ 427/569 |
| 6,148,763 A | | 11/2000 | Akiyama et al. ............ 118/723 |
| 6,155,201 A | | 12/2000 | Murayama et al. ......... 118/723 |
| 6,165,274 A | | 12/2000 | Akiyama et al. ............ 118/724 |
| 6,250,251 B1 | | 6/2001 | Akiyama et al. ............ 118/723 |
| 6,300,225 B1 | | 10/2001 | Okamura et al. ........... 438/478 |
| 6,336,423 B1 | | 1/2002 | Okamura et al. ........... 118/723 |
| 6,528,435 B1 | * | 3/2003 | Yoo ............................ 438/788 |
| 2001/0021422 A1 | * | 9/2001 | Yamakoshi et al. ......... 427/569 |
| 2002/0038631 A1 | * | 4/2002 | Sumiya et al. ........... 118/723 E |
| 2002/0088547 A1 | * | 7/2002 | Tomoyasu et al. ....... 118/723 E |
| 2002/0125207 A1 | * | 9/2002 | Ono et al. ..................... 216/67 |
| 2003/0037881 A1 | * | 2/2003 | Barnes et al. ................. 216/67 |

FOREIGN PATENT DOCUMENTS

| | | |
|---|---|---|
| EP | 0 149 089 | 7/1985 |
| JP | 60-160620 | 8/1985 |
| JP | 6-287760 | 10/1994 |
| JP | 9-321031 | 12/1997 |

* cited by examiner

*Primary Examiner*—Marianne Padgett
(74) *Attorney, Agent, or Firm*—Fitzpatrick, Cella, Harper & Scinto

(57) ABSTRACT

A vacuum processing method comprises placing an article to be processed in a reaction container and simultaneously supplying at least two high-frequency powers having mutually different frequencies to the same high-frequency electrode to generate plasma in the reaction container by the high-frequency powers admitted into the reaction container from the high-frequency electrode so as to process the article to be processed. In the method, at least the high-frequency power having a frequency f1 and the high-frequency power having a frequency f2 are used and satisfy the following two conditions as the high-frequency powers:

$$250\ MHz \geq f1 > f2 \geq 10\ MHz$$

$$0.9 \geq f2/f1 \geq 0.1.$$

14 Claims, 6 Drawing Sheets

(a)

(b)

VACUUM PROCESSING METHOD

BACKGROUND OF THE INVENTION

1. Field of the Invention

The present invention relates to a vacuum processing method using a high-frequency power, which is used for forming a deposited film, etching and so on in semiconductor devices, electrophotographic photosensitive members, image input line sensors, photographing devices, photovoltaic devices and so on.

2. Related Background Art

As for deposited film forming methods used for semiconductor devices, electrophotographic photosensitive members, image input line sensors, photographing devices, photovoltaic devices, other various electronic elements and optical elements, many methods such as a vacuum evaporation method, a sputtering method, an ion plating method, a thermal CVD method, an photo-chemical vapor deposition method and a plasma CVD method are conventionally known, and apparatuses therefor are put into practice.

Among others, the plasma CVD method, that is, a method of decomposing a material gas by a direct current or a high-frequency or a microwave glow discharge to form a thin film-like deposited film on a substrate is currently so commercialized as a suitable method for forming a hydrogenated amorphous silicon deposited film for an electrophotography and so on, and various apparatuses for the method therefor are proposed.

Here, a deposited film forming apparatus using the plasma CVD method will be described by referring to FIG. 4. FIG. 4 is a schematic block diagram showing an example of the conventional deposited film forming apparatus by a RF plasma CVD method using an RF-band frequency as a power supply, which is specifically an apparatus for forming a light-receiving member for an electrophotography.

If roughly divided, this apparatus is comprised of a deposition apparatus 2100, a material gas supplying apparatus 2200 and an exhauster (not shown) for reducing pressure in a reaction container 2101. The reaction container 2101 of the deposition apparatus 2100 has a cylindrical substrate 2112, a substrate supporter 2113 containing a substrate heater 2113a and a material gas admitting pipe 2114 installed therein, and furthermore, a high-frequency matching box 2115 is connected to a cathode electrode 2111 constituting a part of the reaction container 2101. The cathode electrode 2111 is insulated from an earth potential by an insulator 2120, and a high-frequency voltage is applicable between it and the cylindrical substrate 2112 also serving as an anode electrode maintained at the earth potential through the substrate supporting member 2113.

The material gas supplying apparatus 2200 is comprised of a plurality of gas cylinders 2221 to 2226 for accommodating material gases such as $SiH_4$, $GeH_4$, $H_2$, $CH_4$, $B_2H_6$ and $PH_3$, gas cylinder valves 2231 to 2236, gas inflow valves 2241 to 2246, gas outflow valves 2251 to 2256 and massflow controllers 2211 to 2216, where each material gas cylinder is connected to the gas admitting pipe 2114 in the reaction container 2101 via a material gas piping 2116 having a supplementary valve 2260.

Formation of the deposited film of which main component is silicon by using the deposited film forming apparatus thus constituted is performed as follows for instance.

First, the cylindrical substrate 2112 is set in the reaction container 2101, and air is exhausted from inside the reaction container 2101 by an exhauster (a vacuum pump for instance) that is not shown. Subsequently, the substrate heater 2113a built into the substrate supporting member 2113 controls a temperature of the cylindrical substrate 2112 to be the predetermined temperature between 200° C. and 350° C.

To admit the material gas for forming the deposited film into the reaction container 2101, it is checked that the gas cylinder valves 2231 to 2236 and a leak valve 2117 of the reaction container 2101 are closed, and it is also checked that the gas inflow valves 2241 to 2246, gas outflow valves 2251 to 2256 and the supplementary valve 2260 are open, and then a main valve 2118 is opened first to exhaust air from inside the reaction container 2101 and the material gas piping 2116.

Next, the supplementary valve 2260 and the gas outflow valves 2251 to 2256 are closed when a vacuum gage 2119 reads approximately $7\times10^{-1}$ Pa.

Subsequently, the gas cylinder valves 2231 to 2236 are opened to let the gases in from the gas cylinders 2221 to 2226, and each gas pressure is adjusted to be 0.2 Mpa by pressure regulators 2261 to 2266.

Next, the gas inflow valves 2241 to 2246 are gradually opened to admit the gases into the massflow controllers 2211 to 2216.

After preparation for film formation is completed as above, each layer is formed by means of the following procedure.

When the cylindrical substrate 2112 reaches the predetermined temperature, necessary ones of the gas outflow valves 2251 to 2256 and the supplementary valve 2260 are gradually opened to admit predetermined gases into the reaction container 2101 from the gas cylinders 2221 to 2226 via the material gas admitting pipe 2114. Next, an adjustment is made by a predetermined massflow controller of the massflow controllers 2211 to 2216 so that each material gas will have a predetermined flow rate. At that time, openness of the main valve 2118 is adjusted by checking the vacuum gage 2119 so that the pressure in the reaction container 2101 will be a predetermined value.

When internal pressure of the reaction container 2101 becomes stable, an RF power supply of 13.56 MHz frequency (not shown) is set at a desired power, and the RF power is admitted into the reaction container 2101 through the high-frequency matching box 2115 and the cathode electrode 2111 so that the cylindrical substrate 2112 acts as an anode to generate the glow discharge. This discharge energy decomposes the material gases admitted in the reaction container 2101 to form the predetermined deposited film of which main component is silicon on the cylindrical substrate 2112.

After a desired film thickness is formed, supply of the RF power is stopped, and the gas outflow valves 2251 to 2256 are closed to stop inflow of the gases into the reaction container 2101 so as to finish formation of the deposited film. A light-receiving layer having a desired multi-layer structure can be formed by repeating the same operations a plurality of times.

It is needless to say that, when forming each layer, all the gas outflow valves 2251 to 2256 other than those for necessary gases are closed, and as required, an operation of closing the gas outflow valves 2251 to 2256 and opening the supplementary valve 2260 and further fully opening the main valve 2118 is performed to make the inside of the system a high vacuum once and exhaust air from inside the piping for the purpose of avoiding remaining of each gas in the reaction container 2101 and in the piping from the gas outflow valves 2251 to 2256 to the reaction container 2101.

Moreover, to ensure the uniform film thickness and film quality, it is effective to rotate the cylindrical substrate 2112 with a driving system (not shown) at a predetermined speed while forming a layer. Furthermore, it is needless to say that the above-mentioned gas types and valve operations are changed according to conditions for making each layer.

In addition to such conventional deposited film forming apparatuses and methods by an RF plasma CVD method using the above RF-band frequency, a VHF plasma CVD method using a high-frequency power in a VHF band (hereinafter, referred to as the "VHF-PCVD method") is receiving attention in recent years, and development of various types of deposited film formation is actively underway. This is because it is expected that, as the VHF-PCVD method allows a high speed of film deposition and acquisition of a high quality deposited film, it is possible to simultaneously accomplish lower costs and higher quality of products. For instance, Japanese Patent Application Laid-Open No. 6-287760 corresponding to U.S. Pat. No. 5,534,070 discloses the deposited film forming apparatus and method using the high-frequency power of which frequency is 30 MHz to 300 MHz, which is used to form an amorphous silicon light-receiving member for an electrophotography. In addition, development of the deposited film forming apparatus, as shown in FIG. 5A and FIG. 5B, of very high productivity capable of concurrently forming a plurality of electrophotographic light-receiving members is underway.

FIG. 5A and FIG. 5B are a diagram showing another conventional deposited film forming apparatus, where FIG. 5A is a schematic longitudinal section thereof and FIG. 5B is a schematic sectional view along its cutting line 5B—5B in FIG. 5A.

The apparatus shown in FIG. 5A has an exhaust pipe 311 integrally formed on a side of a reaction container 301, and the other end of the exhaust pipe 311 is connected to the exhauster that is not shown. Six cylindrical substrates 305 that have the deposited films formed on their surfaces are placed as if surrounding the center of the reaction container 301 and in parallel. Each cylindrical substrate 305 is held by a rotation axis 308 and heated by a heating element 307. If a motor 309 is driven, the rotation axis 308 rotates via a reduction gear 310 and the cylindrical substrate 305 revolves around its generatrix direction central axis.

A film forming space 306 surrounded by the six cylindrical substrates 305 has the material gases supplied from a material gas supply means 312. A VHF power is supplied to the film forming space 306 by a cathode electrode 302 from a VHF power supply 303 via a matching box 304. At this time, the cylindrical substrates 305 maintained at the earth potential through the rotation axis 308 serve as anode electrodes.

The deposited film formation using such an apparatus can be performed in outline by using the following procedure.

First, the cylindrical substrates 305 are placed in the reaction container 301, and air is exhausted from inside the reaction container 301 through the exhaust pipe 311 by an exhauster that is not shown. Subsequently, the cylindrical substrates 305 are heated and controlled by the heating element 307 at the predetermined temperature of 200 to 300° C. or so.

When the cylindrical substrates 305 reach the predetermined temperature, the material gases are admitted into the reaction container 301 via the material gas supply means 312. After checking that the flow rate of the material gases reached a predetermined flow rate and the pressure in the reaction container 301 became stable, the predetermined VHF power is supplied to the cathode electrode 302 from a high-frequency power supply 303 via a matching box 304. Thus, the VHF power is admitted between the cathode electrode 302 and the cylindrical substrates 305 also serving as the anode electrodes, so that the glow discharge is generated in the film forming space 306 surrounded by the cylindrical substrates 305, and the material gases are dissociated by excitation to form the deposited films on the cylindrical substrates 305.

After the desired film thickness is formed, the supply of the VHF power is stopped, and the supply of the material gases is subsequently stopped so as to finish the deposited film formation. The light-receiving layer having a desired multi-layer structure for an electrophotography is formed by repeating the same operations a plurality of times.

During the deposited film formation, the deposited films are formed all over the surfaces of the cylindrical substrates by rotating the cylindrical substrates 305 at the predetermined speed by the motor 309 via the rotation axis 308.

Excellent deposited film formation, that is, vacuum processing is performed by using the above deposited film forming apparatus and the conventional method. However, the level of market requirement for such products using such vacuum processing is becoming increasingly higher, so that the vacuum processing method capable of implementing higher quality and lower costs is desired in order to meet the requirement.

For instance, in the case of an electrophotographic apparatus, improvement in a copying speed, higher image quality and lower prices are very strongly required, and in order to implement these, it is essential to improve photosensitive member characteristics that are specifically chargeability and sensitivity, control image defects arising from photosensitive member structural faults appearing as white or black points on images and reduce photosensitive member production costs. Moreover, in a digital electrophotographic apparatus and a color electrophotographic apparatus that are becoming remarkably popular in recent years, not only a written manuscript but photos, pictures and designed drawings are also frequently copied so that reduction of image density unevenness is required more strongly than before.

While optimization of deposited film lamination composition and so on are conducted aiming at improvement in such photosensitive member characteristics and reduction of the photosensitive member production costs, improvement in the aspect of the vacuum processing method is also strongly desired.

Under such circumstances, the status quo is that there is still a room left for improvement as to enhancement in vacuum processing characteristics and reduction of the vacuum processing costs in the aforementioned conventional vacuum processing method.

As already mentioned, it is possible to accomplish improvement in the vacuum processing speed and improvement in the vacuum processing characteristics by using the VHF band or the high-frequency power of the frequency in the neighborhood thereof to generate plasma and perform the vacuum processing, and earnest research is conducted for that purpose. In the case of using the high-frequency power in such a frequency band, however, a wavelength of the high-frequency power in the reaction container becomes as long as the reaction container, a high-frequency electrode, a substrate or a substrate holder, and so the high-frequency power is apt to form a standing wave in the reaction container so that this standing wave causes the power to be strong or weak at each location, thus leading to different plasma characteristics. Consequently, it was difficult to render the vacuum processing characteristics further uniform in a broad range.

As means for solving such a problem, it is thinkable to simultaneously supply a plurality of high-frequency powers of different frequencies. While a plurality of standing waves of different wavelengths according to the respective frequencies are thereby formed in the reaction container, the plurality of standing waves are synthesized since they are simultaneously supplied and no definite standing wave is formed as a consequence. Based on this idea, the frequencies of a plurality of different high-frequency powers can have the effect of curbing the standing waves irrespective of their values. For instance, Japanese Patent Application Laid-Open No. 60-160620 (corresponding to EP-0149089) discloses a plasma reactor apparatus with a configuration for supplying the high-frequency power of 10 MHz or higher and that of 1 MHz or lower to the same electrode, and Japanese Patent Application Laid-Open No. 9-321031 (corresponding to U.S. Pat. No. 5,891,252) discloses the plasma processing apparatus with a configuration for simultaneously applying the high-frequency power of a UHF band (300 MHz or higher, 1 GHz or lower) and that having the frequency different therefrom by twice or more.

It is thinkable that, by using these technologies, the standing waves of the high-frequency power in the reaction container are controlled so that uniformity of the vacuum processing will improve.

However, as a result of conducting an experiment on the uniformity of the vacuum processing characteristics by using the technology disclosed by Japanese Patent Application Laid-Open No. 60-160620, the inventors hereof could certainly improve the uniformity to a certain level but could not acquire the uniformity level that is required in recent years. In addition, as a result of conducting the experiment by using the technology disclosed by Japanese Patent Application Laid-Open No. 9-321031, the level was not acquired, either. To be more specific, it became evident that, even by using a power supply method that is rendered uniform in terms of electric field strength, non-uniformity remains to a certain extent in the actual vacuum processing.

SUMMARY OF THE INVENTION

An object of the present invention is to provide a vacuum processing method whereby an article to be processed is placed in a reaction container and at least two high-frequency powers having mutually different frequencies are simultaneously supplied to the same high-frequency electrode to have plasma generated in the above described reaction container by the high-frequency powers admitted into the above described reaction container from the high-frequency electrode so as to process the above described article to be processed, which method is characterized using as the above described high-frequency powers at least the high-frequency power of a frequency f1 and that of a frequency f2 satisfying the following two conditions:

$$250\ MHz \geq f1 > f2 \geq 10\ MHz$$

$$0.9 \geq f2/f1 \geq 0.1.$$

Another object of the present invention is to provide the vacuum processing method whereby improvement in the vacuum processing speed and improvement in the vacuum processing characteristics are accomplished, and in addition, uniformity of the vacuum processing characteristics is rendered very high-level and vacuum processing costs can be reduced.

DETAILED DESCRIPTION OF THE PREFERRED EMBODIMENTS

Figure 1:
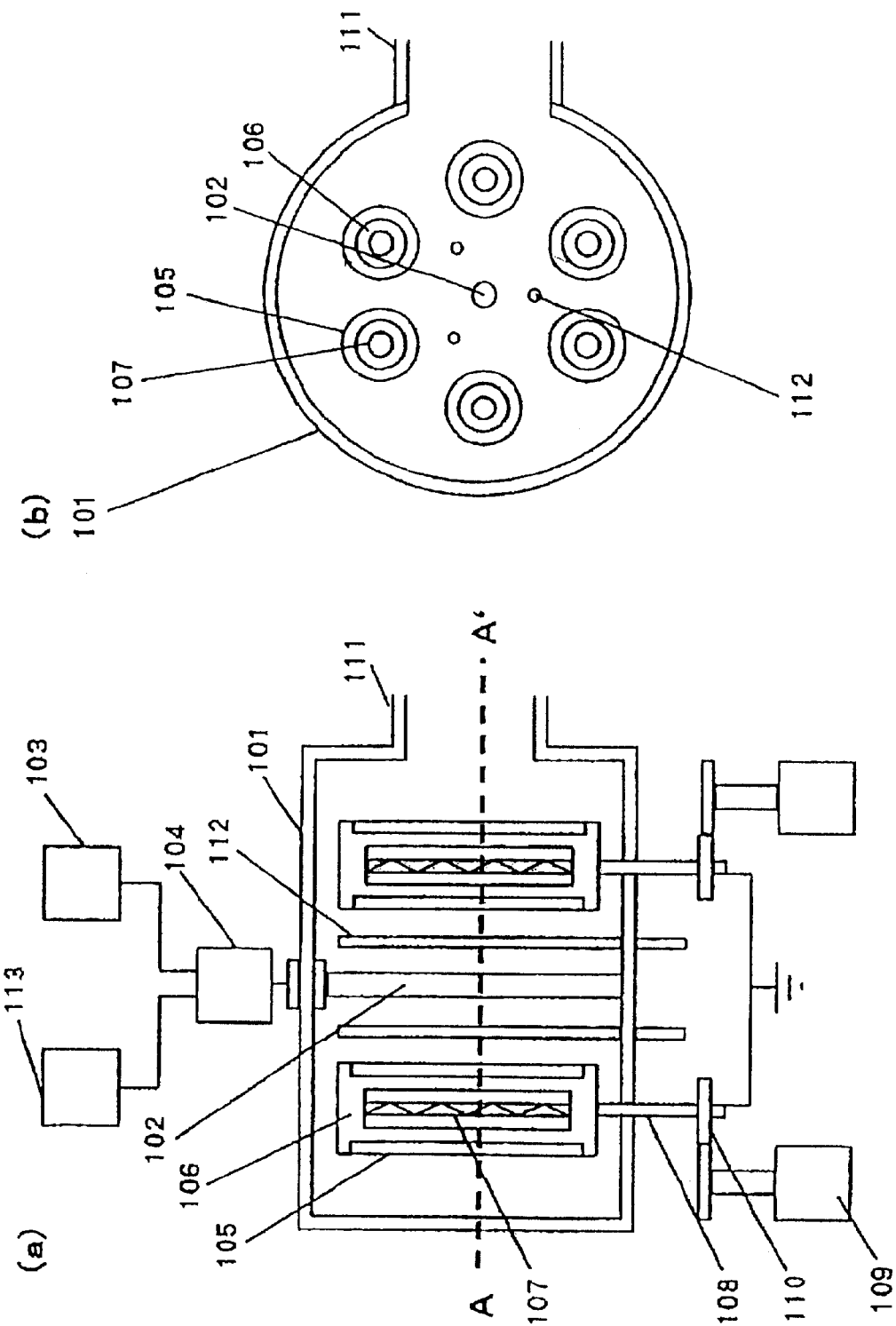
FIGS. 1A and 1B are diagrams showing an embodiment of a deposited film forming apparatus for performing a vacuum processing method of the present invention.

As a result of earnest review for the sake of solving the aforementioned problems and accomplishing the above objects, the inventors hereof found out that an effect of rendering vacuum processing uniform is remarkably changed by supplying a plurality of high-frequency powers of different frequencies to the same electrode and changing a relationship of the frequencies. And they found out that, by causing those frequencies to have a predetermined relationship, improvement in a vacuum processing speed, improvement in vacuum processing characteristics, improvement in uniformity of the vacuum processing characteristics and reduction of vacuum processing costs can be simultaneously implemented, which led to completion of the present invention.

According to a vacuum processing method of the present invention, it is possible to implement improvement in vacuum processing characteristics and reduction of vacuum processing costs and remarkably improve the uniformity of the vacuum processing characteristics at the same time while maintaining a high vacuum processing speed.

While it is not clear at present as to a mechanism wherein the effect of uniformity is remarkably acquired when there is the relationship of the frequencies of the present invention, it is presumed to approximately come from the following workings.

For instance, in the case of the relationship of the frequencies as specifically shown in Japanese Patent Application Laid-Open No. 60-160620, that is, in the case of simultaneously admitting into a processing container the high-frequency power of 10 MHz or higher (hereinafter, referred to as the "high-frequency power") and the high-frequency power of 1 MHz or lower (hereinafter, referred to as the "low frequency power"), electric field standing waves due to the high-frequency power and those due to the low frequency power are mutually synthesized, and so it is possible to control the electric field standing waves in the processing container in terms of the high-frequency electric field.

However, in the case where the frequencies of the high-frequency power and the low frequency power are different by one digit or more, a method of decomposing a material gas by the high-frequency power becomes different from that by the low frequency power, and consequently types and ratios of generated active species become different. Thus, even though they are rendered uniform in terms of electric field strength, many of the active species of the type and the ratio according to the frequencies of the high-frequency power are generated in the antinode portion of the high-frequency power standing waves and many of the active species of the type and the ratio according to the frequencies of the low frequency power are generated in the antinode portion of the low frequency power standing waves. It is thinkable that spatial distribution consequently occurs to the types and ratios of the active species so that the vacuum processing characteristics become no longer uniform.

As opposed to this, it is thinkable that, by maintaining the relationship between frequencies f1 and f2 as that of $f2/f1 \geq 0.1$, the differences in the types and ratios of the generated active species due to the frequency differences cease to be at a level that is problematic in practice.

Moreover, if the frequencies f1 and f2 are mutually too close, node positions and antinode positions of the respective standing waves become close so that the sufficient effect of controlling the electric field standing waves can no longer be obtained. For that reason, it is also considered necessary to maintain the relationship between the frequencies f1 and f2 as that of $0.9 \geq f2/f1$.

In addition, it is thinkable that, if the frequency f1 becomes higher than 250 MHz, attenuation in a traveling direction of power becomes remarkable, and so deviations in attenuation factors between the high-frequency powers of different frequencies become remarkable sufficient so that the sufficient effect of rendering them uniform can no longer be obtained. Furthermore, if the frequency f2 becomes lower than 10 MHz, it is not desirable in terms of the vacuum processing costs since the vacuum processing speed drastically slows down.

For the above reason, it is presumed that, by rendering the frequencies f1 and f2 within the range of the present invention as follows, the effect of improving the vacuum processing characteristics, that is, improving the uniformity of the vacuum processing characteristics can be remarkably acquired while maintaining the high vacuum processing speed:

250 $MHz \geq f1 > f2 \geq 10$ MHz $0.9 \geq f2/f1 \geq 0.1$.

According to the present invention, it becomes possible to remarkably acquire the above effect of the present invention by having a constitution wherein the above described frequency f2 satisfies the following condition:

$f2 \geq 30$ MHz.

Furthermore, it becomes possible to further remarkably acquire the above effect of the present invention by having the constitution wherein the above described frequencies f1 and f2 satisfy the following condition:

$0.9 \geq f2/f1 > 0.5$.

Moreover, the high-frequency powers of which mutually different frequencies are set to have the above relationship are limited to those having the power at a level where the vacuum processing is affected, and so the high-frequency power of a low power such as the frequency of higher harmonics is not limited by the above relationship.

In addition, the powers of other frequencies can further be simultaneously supplied as required. For instance, the power of frequencies of the order of several tens of KHz to several hundred KHz can be simultaneously supplied in addition to the high-frequency powers in the range of the present invention in order to enhance a bias effect during the vacuum processing. Thus, it is necessary, in the case of supplying further powers, to keep the powers to the extent of not spoiling the uniformity of the vacuum processing characteristics by adding them.

In the present invention, such admission of the high-frequency powers into the vacuum processing container must be performed from the same electrode. In the case of supplying the high-frequency powers of different frequencies from different electrodes respectively, there will arise, on the respective electrodes, the standing waves of wavelengths dependent on the frequencies of the high-frequency powers supplied to the respective electrodes. Consequently, characteristics of plasma generated in the neighborhood of the electrodes have shapes according to the standing waves, where the types and ratios of the generated active species and energy of ions incident on the electrodes are different depending on locations, so that structures of the films adhering onto the electrodes are different depending on the locations on the electrodes. For this reason, there will arise portions of the film structures easily peeled off on the electrodes, or there will arise areas where the film structures locationally change and differences in internal stresses will arise therein, thus generating the portions easily peeled off so that the peeled portions will adhere onto the article to be processed and faults will easily occur. In order to avoid such a problem, it is necessary, in the present invention, to supply a plurality of high-frequency powers of different frequencies to the same electrode. Thus, the standing waves are also controlled on the electrodes to effectively control the above-mentioned problems.

In addition, it is desirable, in the present invention, to have the configuration satisfying the following condition when the length of the longest portion of the above described high-frequency electrode is Le, and the wavelength of the high-frequency power having the highest frequency of the above described high-frequency powers in the reaction container is $\lambda 1$, and the wavelength of the high-frequency power having the lowest frequency of the above described high-frequency powers in the reaction container is $\lambda 2$:

$(\lambda 2 - \lambda 1) \times Le/\lambda 2 < \lambda 2/2$.

It becomes possible, by setting such a condition, to mutually deviate on the entire areas on the high-frequency electrodes the node position of the standing wave arising from the high-frequency power having the highest frequency and the node position of the standing wave arising from the high-frequency power having the lowest frequency so that the uniformity of the vacuum processing characteristics will be improved.

It is possible to acquire such effects further remarkably by having the constitution wherein the above described Le, $\lambda 1$ and $\lambda 2$ further satisfy the following condition:

$(\lambda 2 - \lambda 1) \times Le/\lambda 2 < 0.9 \times \lambda 2/2$.

Presumably, this is because it becomes possible to further enlarge the above-mentioned mutual deviation between the node position of the standing wave arising from the high-frequency power having the highest frequency and the node position of the standing wave arising from the high-frequency power having the lowest frequency.

Moreover, the wavelengths of the high-frequency powers in the reaction container can be known by using the well-known probe method, for instance. To be more specific, first of all, the plasma is generated in a state of having the probe inserted in the reaction container. At this time, the high-frequency powers have a single frequency. The probe position is moved in the reaction container in this state to measure distribution of electron density and electron temperature therein. In the case where the plasma generating condition is so-called power limit condition wherein the electron density increases along with the increase in the supplied high-frequency power, the distribution in the electron density according to the standing wave of the high-frequency power is measured. The location of the lowest electron density is equivalent of the node position of the standing wave, and the location of the highest electron density is equivalent of the antinode position thereof. The wavelength of the standing wave is acquired from these node position and antinode position thereof, and the wavelength of the supplied high-frequency power in the reaction container can be known by doubling that wavelength. In the case where the plasma generating condition is so-called flow limit condition wherein the electron density increases along with the increase in the supplied material gas amount, the distribution in the electron temperature according to the standing wave of the high-frequency power is measured. The location of the lowest electron temperature is equivalent of the node position of the standing wave, and the location of the highest electron temperature is equivalent of the antinode position thereof. The wavelength of the standing wave is acquired from these node position and antinode position thereof, and the wavelength of the supplied high-frequency power in the reaction container can be known by doubling that wavelength. As for the means for knowing the wavelength of the high-frequency power in the reaction container, it is possible to use well-known plasma diagnosis methods such as a microwave method and optical measurement method other than the probe method.

It is also possible to know the wavelength of the high-frequency power in the reaction container from a change in the deposited film characteristics in the reaction container. In this case, the deposited film is formed on the substrate placed in the reaction container, and its film characteristics such as location dependency of electric characteristics and optical characteristics are evaluated by a publicly known conventional method, such as electrical conductivity measurement, CPM (Constant Photocurrent Method), visible rays absorption measurement and infrared absorption measurement. The equidistant and periodical location dependency of the film characteristics is thereby verified. That period is the wavelength of the standing wave, and the wavelength of the high-frequency power in the reaction container can be acquired by doubling that length.

According to the present invention, it is further possible to acquire further remarkable effects by having the constitution satisfying the following condition when the length of the longest portion of the conductive portion of the above described article to be processed is Ls, and the wavelength of the high-frequency power having the highest frequency of the above described high-frequency powers in the above described reaction container is $\lambda 1$, and the wavelength of the high-frequency power having the lowest frequency of the above described high-frequency powers in the above described reaction container is $\lambda 2$:

$$(\lambda 2-\lambda 1) \times Ls/\lambda 2 < \lambda 2/2.$$

It is presumably because the high-frequency power supplied into the reaction container from the high-frequency electrode is propagated in the reaction container and a portion thereof is propagated on the conductive portion of the article to be processed. The high-frequency power thus propagated on the article to be processed generates the electric field standing waves according to each wavelength on the conductive portion thereof just as in the case of the electrode. Accordingly, it becomes possible, by setting the above condition, to mutually deviate on the entire areas on the article to be processed the node position of the standing wave arising from the high-frequency power having the highest frequency and the node position of the standing wave arising from the high-frequency power having the lowest frequency so that the uniformity of the vacuum processing characteristics will be improved.

It is possible to acquire such effects further remarkably in the case where the above described Ls, $\lambda 1$ and $\lambda 2$ further satisfy the following condition:

$$(\lambda 2-\lambda 1) \times Ls/\lambda 2 < 0.9 \times \lambda 2/2.$$

Presumably, this is because it becomes possible to further enlarge the above-mentioned mutual deviation between the node position of the standing wave arising from the high-frequency power having the highest frequency and the node position of the standing wave arising from the high-frequency power having the lowest frequency.

In addition, according to the present invention, it is possible to acquire further remarkable effects by having the constitution satisfying the following condition when the above described article to be processed is placed on the holder partially comprised of a conductive member and the length of the longest portion of the conductive portion of the above described holder is Lh, and the wavelength of the high-frequency power having the highest frequency of the above described high-frequency powers in the above described reaction container is $\lambda 1$, and the wavelength of the high-frequency power having the lowest frequency of the above described high-frequency powers in the above described reaction container is $\lambda 2$:

$$(\lambda 2-\lambda 1) \times Lh/\lambda 2 < \lambda 2/2.$$

It is presumably because the high-frequency power supplied into the reaction container from the high-frequency electrode is propagated in the reaction container and a portion thereof is propagated on the conductive portion of the holder. Consequently, the uniformity of the vacuum processing characteristics will presumably be improved due to the same workings as the case of superimposing the high-frequency power on the article to be processed.

It is possible to acquire such effects further remarkably in the case where the above described Lh, $\lambda 1$ and $\lambda 2$ further satisfy the following condition:

$$(\lambda 2-\lambda 1) \times Lh/\lambda 2 < 0.9 \times \lambda 2/2.$$

Presumably, this is because it becomes possible to further enlarge the above-mentioned mutual deviation between the node position of the standing wave arising from the high-frequency power having the highest frequency and the node position of the standing wave arising from the high-frequency power having the lowest frequency.

Moreover, the holder length here refers to the length between the most distant parts of the electrically conductive holder parts. For instance, even in the case where the conductive holder is divided in two and the substrate is placed between them, if the substrate has conductivity, the divided two holders are electrically in a conductive state so that the distance between the most distant parts of the two holders is the holder length.

Figure 6:
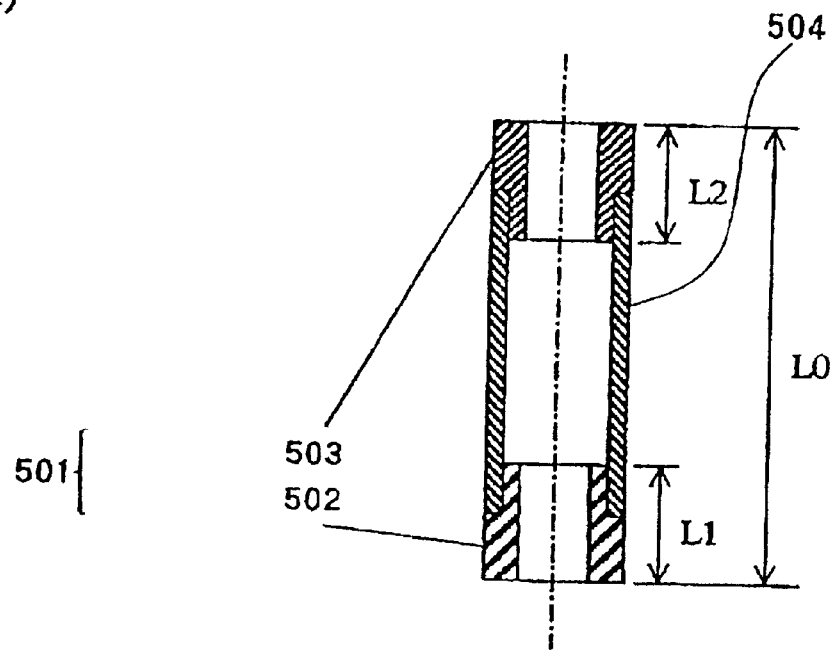
FIGS. 6A and 6B are diagrams for explaining a definition of a length of a holder placed on the deposited film forming apparatus.
Figure 6:
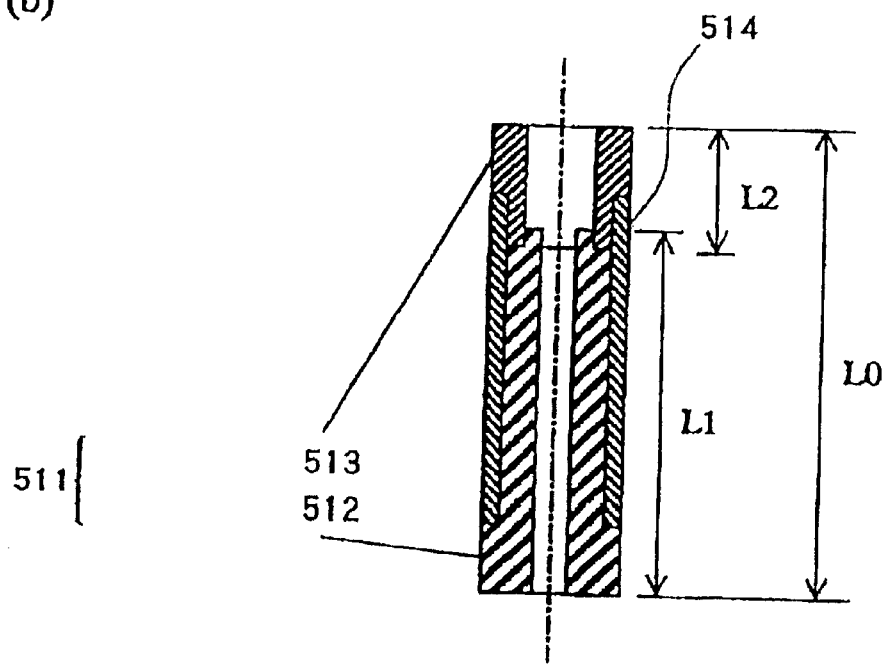

For instance, in the case of the constitution shown in FIG. 6A, a conductive holder 501 is divided into a lower holder 502 and an upper holder 503 of which lengths are L1 and L2 respectively. In the case where a substrate 504 is conductive, however, the holder length is L0 since the lower holder 502 and the upper holder 503 are in a conductive state.

Moreover, as the constitution shown in FIG. 6B, in the case where a conductive holder 511 is comprised of a first holder 512 and a second holder 513 that are mutually in a conductive state, the holder length is L0 whether or not a substrate 514 is conductive.

In addition, the present invention may have the constitution wherein the above described high-frequency electrode is formed in a rod-like shape. In the case where the electrode has a rod-like shape substantially capable of handling as one dimension, it is possible to acquire the effects of the present invention more remarkably since the power is not substantially diffracted laterally to the direction of travel so that no secondary standing wave occurs due to the lateral diffraction of the power.

Further, in the present invention, the high-frequency electrode described above may be a single or in a plurality.

Moreover, the present invention may have the constitution wherein the above described article to be processed is formed in a cylindrical or columnar shape. In the case where the article to be processed is formed in a cylindrical or columnar shape, reflection ends of the high-frequency power on the article to be processed is limited to both ends thereof. For that reason, the electric field strength at the antinode position of the standing wave is higher and it allows the node position of the standing wave generated by the power of another frequency, that is, the portion of low electric field strength to be effectively complemented compared with the case where many reflection ends exist and many standing waves occur accordingly, so that it is possible to acquire the effects of the present invention further remarkably.

Furthermore, according to the present invention, it is possible to acquire remarkable effects especially in the case of forming the deposited film on the surface of the above described article to be processed. According to the present invention, as the electric field distribution in the entire areas in the reaction container including those on the electrodes is rendered uniform, local changes of the film structure is effectively controlled in the entire areas of the parts where film adhesion is caused. Consequently, film peeling possibly caused by the local changes of the internal stresses is effectively controlled, and accordingly the fault on the article to be processed caused by adhesion of the peeled film thereon is significantly reduced.

Moreover, the present invention is more effective in the case of forming the deposited film for electrophotographic photosensitive members on the surface of the above described article to be processed. To form the deposited film for the electrophotographic photosensitive members, it is necessary to form the deposited film of large area, and it is further necessary that no structural fault exist in the entire area thereof. On the other hand, as formation of the deposited film having a thickness of several tens of $\mu$m is generally performed in formation of the electrophotographic photosensitive members, the film adhesion on a wall of the vacuum processing container often occurs and the film adhered to the wall is apt to be peeled. Furthermore, it is not possible for the electrophotographic photosensitive members, in the case where the structural fault occurs, to handle only the portion in which the fault exists as faulty and handle other areas as conforming as other devices do, so that the entire deposited film formed over the large area becomes faulty. For this reason, an occurrence of the structural fault influences the costs very significantly in the formation of the electrophotographic photosensitive members, and so it is very effective at reducing production costs to effectively control the structural fault by applying the present invention.

Next, embodiments of the present invention will be described by referring to the drawings.

FIGS. 1A and 1B are a schematic view showing an example of an amorphous silicon photosensitive member manufacturing apparatus capable of performing the vacuum processing method of the present invention, where FIG. 1A is a schematic sectional view thereof, and FIG. 1B is a schematic sectional view along a cutting line 1B—1B in FIG. 1A.

In the apparatus shown in FIG. 1A, an exhaust pipe 111 is integrally formed on a side of a reaction container 101, and the other end of the exhaust pipe 111 is connected to the exhauster that is not shown. Six cylindrical substrates 105 that have the deposited films formed are placed in a state of being mounted on a holder 106 as if surrounding the center of the reaction container 101 and mutually in parallel. Each cylindrical substrate 105 is held by a rotation axis 108 and heated by a heating element 107. If a motor 109 is driven, the rotation axis 108 rotates via a reduction gear 110 and the cylindrical substrate 105 revolves around its generatrix direction central axis.

The material gases are supplied into the reaction container 101 from a material gas supply means 112. In addition, the high-frequency powers having different frequencies are simultaneously supplied to a high-frequency electrode 102 from two high-frequency power supplies 103 and 113 via a matching box 104, and those high-frequency powers are admitted into the reaction container 101 from the high-frequency electrode 102. At this time, the cylindrical substrates 105 maintained at the earth potential through the rotation axis 108 and the walls of the reaction container 101 serve as anode electrodes.

As for the high-frequency power supplies 103 and 113, the power supplies capable of rendering the relationship between mutual oscillation frequencies as follows are used in the case where, for instance, the oscillation frequency of the high-frequency power supply 103 is f1 and that of the high-frequency power supply 113 is f2:

$$250\ MHz \geq f1 > f2 \geq 10\ MHz$$

$$0.9 \geq f2/f1 \geq 0.1.$$

Moreover, while the two power supplies capable of outputting the high-frequency powers of the two different frequencies satisfying the above range are used in the apparatus in FIG. 1, the present invention requires that the high-frequency powers of the two or more different frequencies can be supplied, and there may also be three or more high-frequency power supplies. In addition, in the case of using the power supply capable of outputting the high-frequency power wherein a plurality of frequencies are synthesized in advance, there may be only one power supply. In any case, it has the constitution capable of simultaneously supplying the high-frequency powers of at least two different frequencies to the same electrode and also capable of rendering the relationship between the two different frequencies f1 and f2 as follows:

$$250\ MHz \geq f1 > f2 \geq 10\ MHz$$

$$0.9 \geq f2/f1 \geq 0.1.$$

Moreover, in the present invention, it is possible to acquire the effect of rendering the vacuum processing characteristics more remarkably uniform, when the length of the high-frequency electrode 102 is Le and the wavelengths of the high-frequency powers supplied from the high-frequency power supplies 103 and 113 in the reaction container 101 are λ1 and λ2 (λ1<λ2) respectively, by rendering the relationship among those Le, λ1 and λ2 preferably as (λ2−λ1)×Le/λ2<λ2/2, or more preferably as (λ2−λ1)×Le/λ2<0.9×λ2/2.

Furthermore, it is possible to acquire the effect of rendering the vacuum processing characteristics more remarkably uniform, when the length of the cylindrical substrate 105 is Ls, by rendering it preferably as (λ2−λ1)×Ls/λ2<λ2/2, or more preferably as (λ2−λ1)×Ls/λ2<0.9×λ2/2.

In addition, it is possible to acquire the effect of rendering the vacuum processing characteristics more remarkably uniform, when the length of the holder 106 is Lh, by rendering it preferably as (λ2−λ1)×Lh/λ2<λ2/2, or more preferably as (λ2−λ1)×Lh/λ2<0.9×λ2/2.

As for the shape of the cathode electrode 102, while there is no particular limit, it is desirable to have the rod-like or linear shape as shown in FIG. 1A in order to acquire the effect of rendering the vacuum processing characteristics more remarkably uniform, and it is also desirable to have the constitution comprised of curved surfaces as much as possible from a viewpoint of the film peeling, where the columnar and cylindrical shapes are especially preferable.

It is desirable that the surface of the cathode electrode 102 is roughened for the purposes of improving the film's adhesion, preventing the film peeling and controlling dust in the generated film. As for the concrete degree of roughening, the range from 5 μm to 200 μm inclusive in 10-point average roughness (Rz) with reference length of 2.5 mm is preferable.

Furthermore, from a viewpoint of improvement in the film's adhesion, it is effective to have the surface of the high-frequency electrode 102 coated with a ceramic material. While there is no particular limit as to the concrete means of coating, the surface of the high-frequency electrode 102 may be coated by a surface coating method such as the CVD method or thermal spraying, for instance. Of the coating methods, the thermal spraying is preferable in terms of the costs and since it is hardly limited as to the size and shape of the object to be coated.

Moreover, it is effective to have the constitution wherein the outside of the high-frequency electrode 102 is covered with the ceramic material having the shape of a pipe and so on. As for concrete ceramic materials, alumina, titanium dioxide, aluminum nitride, boron nitride, zircon, cordierite, zircon cordierite, silicon oxide, beryllium oxide mica ceramics and so on can be named. While there is no particular limit to the thickness of the ceramic material for coating the surface of the high-frequency electrode 102, 1 μm to 10 mm is preferable, and 10 μm to 5 mm is more preferable for the sake of increasing durability and uniformity and in the aspects of high-frequency power absorption volume and production costs.

Furthermore, it is possible to further enhance the adhesion on the surface of the high-frequency electrode 102 and accomplish prevention of the film peeling more effectively by providing heating or cooling means to the high-frequency electrode 102. In this case, it is determined whether to heat or cool the high-frequency electrode 102 as appropriate according to the deposited film material and deposition conditions. As for concrete heating means, there is no particular limit as far as it is a heating element. To be more specific, electrical resistance heating elements such as a winding heater of a sheath-like heater, a plate-like heater and a ceramic heater, and thermal radiation lamp heating elements such as a halogen lamp and an infrared ray lamp, heating elements by heat exchange means having media such as liquids and gases can be named. In addition, as for concrete cooling means, there is no particular limit as far as it is an endothermic element. For instance, a cooling coil, a cooling plate, a cooling dome and so on capable of shedding liquids, gases and so on as coolant can be named.

The deposited film formation by using such an apparatus can generally be performed by employing the following procedure.

First, the cylindrical substrates 105 are installed in the reaction container 101, and the air is exhausted from inside the reaction container 101 through the exhaust pipe 111 by the exhauster that is not shown. Subsequently, the heating element 107 heats and controls the cylindrical substrates 105 to be at the predetermined temperature between 200° C. and 300° C. or so.

When the cylindrical substrates 105 reach the predetermined temperature, the material gases are admitted into the reaction container 101 via the material gas supply means 112. After checking that the flow rate of the material gases became the set flow rate and the pressure in the reaction container 101 became stable, the high-frequency power having the frequency f1 and the high-frequency power having the frequency f2 satisfying the following two relationships are supplied to the high-frequency electrode 102 from the high-frequency power supplies 103 and 113 via the matching box 104:

$$250\ MHz \geq f1 > f2 \geq 10\ MHz$$

$$0.9 \geq f2/f1 \geq 0.1.$$

Thus, the high-frequency powers of two different frequencies are admitted into the reaction container 101, glow discharge is generated in the reaction container 101, and the material gases are dissociated by excitation to form the deposited films on the cylindrical substrates 105.

After the desired film thickness is formed, the supply of the high-frequency power is stopped, and the supply of the material gases is subsequently stopped so as to finish the deposited film formation. The light-receiving layer having a desired multi-layer structure is formed by repeating the same operations a plurality of times.

During the deposited film formation, the deposited films are formed all over the surfaces of the cylindrical substrates by rotating the cylindrical substrates 105 at the predetermined speed by the motor 109 via the rotation axis 108.

Embodiments

The vacuum processing method of the present invention will be described further in detail hereinafter by showing the embodiments. However, the scope of the present invention will by no means be limited by these embodiments.

First Embodiment

Five lots (total 30 pieces) of the amorphous silicon photosensitive member comprised of a charge injection blocking layer, a photoconductive layer and a surface layer were produced in the units of six pieces per lot on the cylindrical substrate 105 made of aluminum of which diameter is 80 mm and length is 358 mm on the conditions shown in Table 1 below by using the deposited film forming apparatus shown in FIG. 1A under the respective stipulations that the oscillation frequency of the high-frequency power supply 103 is 100 MHz and the oscillation frequencies of the high-frequency power supply 113 are 10 MHz, 27 MHz, 54 MHz, 68 MHz and 90 MHz. Moreover, the output of the high-frequency power supply 103 is 95 percent of the total output and the output of the high-frequency power supply 113 is 5 percent of the total output.

The high-frequency electrode 102 is made of SUS (stainless steel) and has the cylindrical shape of which length is 45 cm and diameter is 20 mm and configured to be covered by a pipe made of alumina of which internal diameter is 21 mm and external diameter is 24 mm. This pipe made of alumina is blast-processed and the surface roughness of this pipe is 20 μm in Rz with reference length of 2.5 mm. Six cylindrical substrates 105 are placed equidistantly on a circumference centered on the high-frequency electrode 102.

The high-frequency powers outputted from the high-frequency power supplies 103 and 113 are supplied to the matching box 104 on different coaxial routes respectively, and the respective powers are synthesized therein and then admitted into the reaction container 101 from the high-frequency electrode 102. Moreover, a filter circuit (not shown) is provided in the matching box 104 so that each high-frequency power will not flow into the other high-frequency power supply.

The holder 106 on which the cylindrical substrate 105 is mounted is made of 450-mm long aluminum, and its surface is blast-processed. The cylindrical substrate 105 is mounted at the center of the holder 106, and the distance from the end of the cylindrical substrate 105 to the end of the holder 106 is 46 mm both in the upper and lower parts.

The material gas supply means 112 used here is comprised of the pipe made of alumina of which internal diameter is 10 mm and external diameter is 13 mm with its ends sealed, and configured to be capable of supplying the material gases from ten exhaust nozzles of which diameter is 1.2 mm provided on side walls of the pipe. The set location of the material gas supply means 112 is inside a layout circle made by the cylindrical substrates 105. Three material gas supply means 112 are equidistantly placed on the same circumference having the same center as the layout circle of the cylindrical substrates 105. The surface of the material gas supply means 112 is blast-processed and its surface roughness is 20 μm in Rz with reference length of 2.5 mm.

The procedure of producing the photosensitive member of the present invention is generally as follows.

First, the cylindrical substrates 105 held on the substrate holders 106 were placed on the rotation axes 108 in the reaction container 101. Thereafter, the air was exhausted from inside the reaction container 101 through the exhaust pipe 111 by the exhauster that is not shown. Subsequently, the cylindrical substrates 105 were rotated by the motor 109 via the rotation axes 108 at the speed of 10 rpm, and further the cylindrical substrates 105 were heated and controlled to be 250° C. by the heating element 107 while supplying an Ar gas of which flow rate is 500 ml/min (normal) into the reaction container 101 from the material gas supply means 112, and that state was maintained for two hours.

Next, the supply of the Ar gas was stopped and the air was exhausted from inside the reaction container 101 through the exhaust pipe 111, and then the material gases to be used for forming the charge injection blocking layer shown in Table 1 below were admitted via the material gas supply means 112. After checking that the flow rates of the material gases became the set flow rates and the pressure in the reaction container 101 became stable, all the outputs were set at the powers shown in Table 1 in the state where the output of the high-frequency power supply 103 is 95 percent of the total output and the output of the high-frequency power supply 113 is 5 percent of the total output, and then the high-frequency powers were supplied to the high-frequency electrode 102 via the matching box 104. The charge injection blocking layer was formed on the cylindrical substrates 105 by dissociating the material gases by excitation with the high-frequency powers radiated into the reaction container 101 from the high-frequency electrode 102. After the desired film thickness was formed, the supply of the high-frequency powers was stopped, and the supply of the material gases was stopped so as to finish the formation of the charge injection blocking layer. The photoconductive layer and the surface layer were sequentially formed by repeating the same operations a plurality of times.

TABLE 1

| | Charge injection blocking layer | Photo-conductive layer | Surface layer |
|---|---|---|---|
| Gas type and flow rate | | | |
| $SiH_4$ [ml/min (normal)] | 200 | 300 | 20 |
| $H_2$ [ml/min (normal)] | 200 | 1000 | |
| $B_2H_6$ [ppm] To $SiH_4$ | 1000 | 1.2 | |
| $CH_4$ [ml/min (normal)] | | | 50 |
| NO [ml/min (normal)] | 10 | | |
| Substrate temperature [° C.] | 250 | 250 | 250 |
| Internal pressure [Pa] | 1.3 | 1.3 | 1.5 |
| High-frequency power supply total output [W] (Sum of the high-frequency power supply 103 output and the high-frequency power supply 113 output) | 900 | 1800 | 700 |
| Film thickness [μm] | 3 | 30 | 0.5 |

As opposed to this, as a first example for comparison, five lots (total 30 pieces) of the amorphous silicon photosensitive member comprised of the charge injection blocking layer, the photoconductive layer and the surface layer on the conditions shown in Table 1 were produced in the units of six pieces per lot on the cylindrical substrate 105 made of aluminum of which diameter is 80 mm and length is 358 mm just as in the embodiment 1 except that the oscillation frequencies of the high-frequency power supply 113 are 7 MHz and 95 MHz. Moreover, the output of the high-frequency power supply 103 was 95 percent of the total output and the output of the high-frequency power supply 113 was 5 percent of the total output.

The amorphous silicon photosensitive members of the first embodiment and the first example for comparison that had been thus produced were placed on a Canon copying machine NP-6750 remodeled for testing purposes to evaluate the characteristics of the photosensitive members. Evaluation items were "image density unevenness," "chargeability," "optical memory" and "image defect," and each item was evaluated by the following evaluation method.

Image Density Unevenness

First, a main band electric appliance current was adjusted so that a dark portion potential at a developing apparatus position became a fixed value, and then image exposure was adjusted by using predetermined white paper of 0.1 or less reflection density as a manuscript so that a light portion potential at the developing apparatus position became a predetermined value. Next, a Canon half tone chart (part number: FY9-9042) was put on a manuscript pad, and an evaluation was performed by a difference between the highest value and the lowest value of reflection density in the entire area on a copy image acquired on copying. The evaluation result was an average of all the photosensitive members. Accordingly, the smaller the value is, the better it is.

Chargeability

The dark portion potential at the developing apparatus position was measured when feeding a constant current through the main band electric appliance of the copying machine. Accordingly, it indicates that the larger the dark portion potential is, the better the chargeability is. The chargeability was measured in the entire areas of the photosensitive member generatrix direction, and the evaluation was performed by the lowest dark portion potential thereof. The evaluation result was the average of all the photosensitive members. Accordingly, the larger the value is, the better it is.

Optical Memory

The current value of the main band electric appliance was adjusted so that the dark portion potential at the developing apparatus position became the predetermined value, and then image exposure was adjusted so that the light portion potential became the predetermined value when using the predetermined white paper as the manuscript. In this state, the evaluation was performed on the copy image when a Canon ghost test chart (part number: FY9-9040) on which black circles of 1.1 reflection density and 5-mm diameter were affixed was put on the manuscript pad, and the Canon half tone chart (part number: FY9-9042) was put thereon, by measuring the difference between the reflection density of the black circles of the 5-mm diameter of the ghost chart recognized on the half tone copy and that of the half tone portion. The optical memory was measured in the entire areas of the photosensitive member generatrix direction, and the evaluation was performed by the maximum difference in the reflection density thereof. The evaluation result was the average of all the photosensitive members. Accordingly, the smaller the value is, the better it is.

Image Defect

The Canon half tone chart (part number: FY9-9042) was put on the manuscript pad, and white dots of 0.1 mm-or-more diameter in the same area of the copy image obtained on copying were counted, and the evaluation was performed by the number thereof. Accordingly, the smaller the value is, the better it is.

These evaluation results are shown in Table 2.

TABLE 2

| Frequency [MHz] | Image density unevenness | Chargeability | Optical memory | Image defect |
| --- | --- | --- | --- | --- |
| 10 (embodiment 1) | A | B to A | B to A | A |
| 27 (embodiment 1) | A | B to A | B to A | A |
| 54 (embodiment 1) | AA | A | AA to A | AA |
| 68 (embodiment 1) | AA | A | AA to A | AA |
| 90 (embodiment 1) | AA | A | AA to A | AA |
| 95 (example for comparison 1) | B | B | B | B |

In Table 2, the evaluation results are using as the reference the evaluation results when the oscillation frequency of the high-frequency power supply 113 is 7 MHz in the first example for comparison.

As for the image density unevenness, it is indicated as AA if the maximum reflection density difference improved to less than ¼, AA to A if improved to ¼ to less than ½, A if improved to ½ to less than ¾, A to B if improved to ¾ or more, B if equivalent, and C if deteriorated.

In addition, as for the chargeability, it is indicated as AA if improved by 10 percent or more, AA to A if improved by 5 to less than 10 percent, A if improved by 2.5 to less than 5 percent, and A to B if improved by less than 2.5 percent, B if equivalent, and C if deteriorated.

As for the optical memory, it is indicated as AA if the maximum reflection density difference improved to less than ¼, AA to A if improved to ¼ to less than ½, A if improved to ½ to less than ¾, A to B if improved to ¾ or more, B if equivalent, and C if deteriorated.

As for the image defect, it is indicated as AA if the number of the white dots of 0.1 mm-or-more diameter improved to less than ¼, AA to A if improved to ¼ to less than ½, A if improved to ⅔ to less than ¾, A to B if improved to ¾ or more, B if equivalent, and C if deteriorated.

As seen from the results shown in Table 2, the effect of rendering the vacuum processing characteristics of the present invention more remarkably uniform was recognized in all the items of "image density unevenness," "chargeability," "optical memory" and "image defect" in this embodiment wherein the oscillation frequency f2 of the high-frequency power supply 113 is 90 MHz≧f2≧10 MHz, and in particular, the effect was remarkably recognized in the range of 90 MHz≧f2≧50 MHz.

That is, when the oscillation frequency of the high-frequency power supply 103 is f1 and that of the high-frequency power supply 113 is f2, a good characteristic for rendering the vacuum processing characteristics remarkably uniform was acquired in the relation of 0.9 ≧f2/f1≧0.1, and especially good results were obtained in the relation of 0.9≧f2/f1>0.5.

In addition, the electrophotographic images formed by using the electrophotographic photosensitive members produced in this embodiment were very excellent without any image smearing and so on.

Second Embodiment

An amorphous silicon film was formed on the cylindrical substrate 105 made of aluminum of which diameter is 80 mm and length is 358 mm on the conditions shown in Table 3 by using the deposited film forming apparatus shown in FIG. 1A and setting the oscillation frequency of the high-frequency power supply 103 at 250 MHz and that of the high-frequency power supply 113 at 140 MHz.

On the surface of the cylindrical substrate 105, a glass substrate (Corning #7059) on which a comb-shaped electrode having a 250 μm-wide gap made of Cr for evaluating electric characteristics was evaporated was placed as an electric characteristics evaluation board. The electric characteristics evaluation boards were placed in the entire areas in the axial direction of the cylindrical substrate 105 so that the comb-shaped electrodes were placed with 1-cm spacing in the axial direction.

The high-frequency electrode 102 is made of SUS (stainless steel) and has the cylindrical shape of which diameter is 20 mm and configured to be covered by the pipe made of alumina of which internal diameter is 21 mm and external diameter is 24 mm. This pipe made of alumina is blast-processed and the surface roughness of this pipe is 20 μm in Rz with reference length of 2.5 mm. In this embodiment, the amorphous silicon film was formed on the seven conditions wherein the length of the high-frequency electrode 102 thus configured is 30 cm, 35 cm, 40 cm, 45 cm, 50 cm, 55 cm and 60 cm.

The high-frequency powers outputted from the high-frequency power supplies 103 and 113 are supplied to the matching box 104 by different coaxial lines respectively, and are admitted into the reaction container 101 from the high-frequency electrode 102 after the respective powers are synthesized in the matching box 104. Moreover, a filter circuit (not shown) is provided in the matching box 104 so that each high-frequency power will not flow into the other high-frequency power supply.

Six cylindrical substrates 105 are placed equidistantly on a circumference centered on the high-frequency electrode 102. The holder 106 on which the cylindrical substrate 105 is mounted is made of 450-mm long aluminum, and its surface is blast-processed. The cylindrical substrate 105 is mounted at a position of 20 mm from the top end of the holder 106 and 72 mm from the bottom end thereof.

The material gas supply means 112 used here is comprised of the pipe made of alumina of which internal diameter is 10 mm and external diameter is 13 mm with its ends sealed, and constituted to be capable of supplying the material gases from the ten exhaust nozzles of which diameter is 1.2 mm provided on the side walls of the pipe. The set location of the material gas supply means 112 is inside the layout circle made by the cylindrical substrates 105. Three material gas supply means 112 are equidistantly placed on the same circumference having the same center as the layout circle of the cylindrical substrates 105. The surface of the material gas supply means 112 is blast-processed and its surface roughness is 20 μm in Rz with reference length of 2.5 mm.

In such an apparatus constitution, the wavelengths of the high-frequency powers in the reaction container 101 were measured prior to the formation of the amorphous silicon film. Plasma was generated in the reaction container 101 on the conditions shown in Table 3 except that an output value of the high-frequency power supply 103 was 800W and that of the high-frequency power supply 113 was 0W. At this time, the length of the high-frequency electrode 102 was 60 cm. A probe was inserted into the reaction container 101 in a state where the plasma was generated, and electron temperature at the position of 2 cm from the surfaces of the cylindrical substrate 105 and the holder 106 was measured with 1-cm spacing in the axial direction thereof. Distribution of the electron temperature was obtained in the axial direction of the cylindrical substrate 105 and the holder 106, and local drops of the electron temperature were checked with 12-cm spacing. Consequently, it was found out that the wavelength of the high-frequency power of 250-MHz frequency in the reaction container 101 was 24 cm. The wavelength of the high-frequency power of 140-MHz frequency in the reaction container 101 is 43 cm, if calculated based on this consequence.

Next, five lots of the amorphous silicon film was formed, by generally using the following procedure, in the cases where the length of the high-frequency electrode 102 is 30 cm, 35 cm, 40 cm, 45 cm, 50 cm, 55 cm and 60 cm respectively.

First, the cylindrical substrates 105 having the electric characteristics evaluation board fixed on their surfaces in a state of being held by the substrate holders 106 were placed on the rotation axes 108 in the reaction container 101. Thereafter, the air was exhausted from inside the reaction container 101 through the exhaust pipe 111 by the exhauster that is not shown. Subsequently, the cylindrical substrates 105 were rotated by the motor 109 via the rotation axes 108 at the speed of 10 rpm, and further the electric characteristics evaluation boards mounted on the cylindrical substrates 105 were heated and controlled by the heating element 107 so that its surface temperature became 250° C. while supplying the Ar gas of which flow rate is 500 ml/min (normal) into the reaction container 101 from the material gas supply means 112, and that state was maintained for two hours.

Next, the supply of the Ar gas was stopped and the air was exhausted from inside the reaction container 101 through the exhaust pipe 111, and then the material gases of the flow rates shown in Table 3 below were admitted via the material gas supply means 112. After checking that the flow rates of the material gases became the set flow rates and the pressure in the reaction container 101 became stable on the condition indicated in Table 3, the output values of the high-frequency power supplies 103 and 113 were set at the values shown in Table 3, and the high-frequency powers were supplied to the high-frequency electrode 102 via the matching box 104. The material gases were dissociated by excitation with the high-frequency powers radiated into the reaction container 101 from the high-frequency electrode 102 so as to form the amorphous silicon film on the electric characteristics evaluation boards mounted on the cylindrical substrates 105. After the predetermined film thickness was formed, the supply of the high-frequency powers was stopped, and then the supply of the material gases was stopped so as to finish the formation of the amorphous silicon film.

TABLE 3

| | |
|---|---|
| Gas type and flow rate SiH$_4$ [ml/min (normal)] | 100 |
| Substrate temperature [° C.] | 250 |
| Internal pressure [Pa] | 1.3 |
| High-frequency power supply 103 output [W] | 750 |
| High-frequency power supply 113 output [W] | 50 |
| Film thickness [μm] | 1 |

As opposed to this, as a second example for comparison, the amorphous silicon film was formed on the conditions shown in Table 3 just as in the embodiment 2 except that the oscillation frequency of the high-frequency power supply 113 is 20 MHz.

As for the amorphous silicon films of the second embodiment and second example for comparison thus formed, photosensitivity unevenness was evaluated by the following evaluation method.

Photosensitivity Unevenness

The evaluation was performed by measuring ((photoconductivity σp)/(dark conductivity σd)) of the deposited films acquired on the electric characteristics evaluation boards. The photoconductivity cup was the conductivity when a He—Ne laser (632.8-nm wavelength) of intensity of 1 mW/cm$^2$ is radiated. Accordingly, it shows that the larger the value of photosensitivity is, the better the deposited film characteristics are. The (maximum photosensitivity)/(minimum photosensitivity) was acquired for each lot, and the evaluation result was the average thereof.

The evaluation results are shown in Table 4.

TABLE 4

| Length of high-frequency electrode [cm] | 30 | 35 | 40 | 45 | 50 | 55 | 60 |
|---|---|---|---|---|---|---|---|
| (λ2 − λ1) × Le/λ2 [cm] | 13.2 | 15.4 | 17.6 | 19.8 | 22.0 | 24.2 | 26.4 |
| λ2/2 [cm] | 21.4 | 21.4 | 21.4 | 21.4 | 21.4 | 21.4 | 21.4 |
| 0.9 × λ2/2 [cm] | 19.3 | 19.3 | 19.3 | 19.3 | 19.3 | 19.3 | 19.3 |
| Photosensitivity unevenness (embodiment 2) | AA | AA | AA | AA to A | A | A | A |

In Table 4, the evaluation results of the deposited films according to this embodiment are using as the reference the evaluation results when the oscillation frequency of the high-frequency power supply 113 is 20 MHz in the second example for comparison for each length of the high-frequency electrode 102, where it is indicated as AA if the photosensitivity unevenness improved to less than ¼, AA to A if improved to ¼ to less than ½, A if improved to ½ to less than ¾, A to B if improved to ¾ or more, B if equivalent, and C if deteriorated.

It was found out, from the results shown in Table 4, that the effects of the present invention are remarkably acquired by satisfying $(\lambda 2-\lambda 1) \times Le/\lambda 2 < \lambda 2/2$, and further remarkably acquired by satisfying $(\lambda 2-\lambda 1) \times Le/\lambda 2 < 0.9 \times \lambda 2/2$, when the power of the shortest wavelength of the high-frequency powers admitted into the reaction container is $\lambda 1$, and the power of the longest wavelength thereof is $\lambda 2$ and the length of the high-frequency electrode is Le.

Third Embodiment

Figure 2:
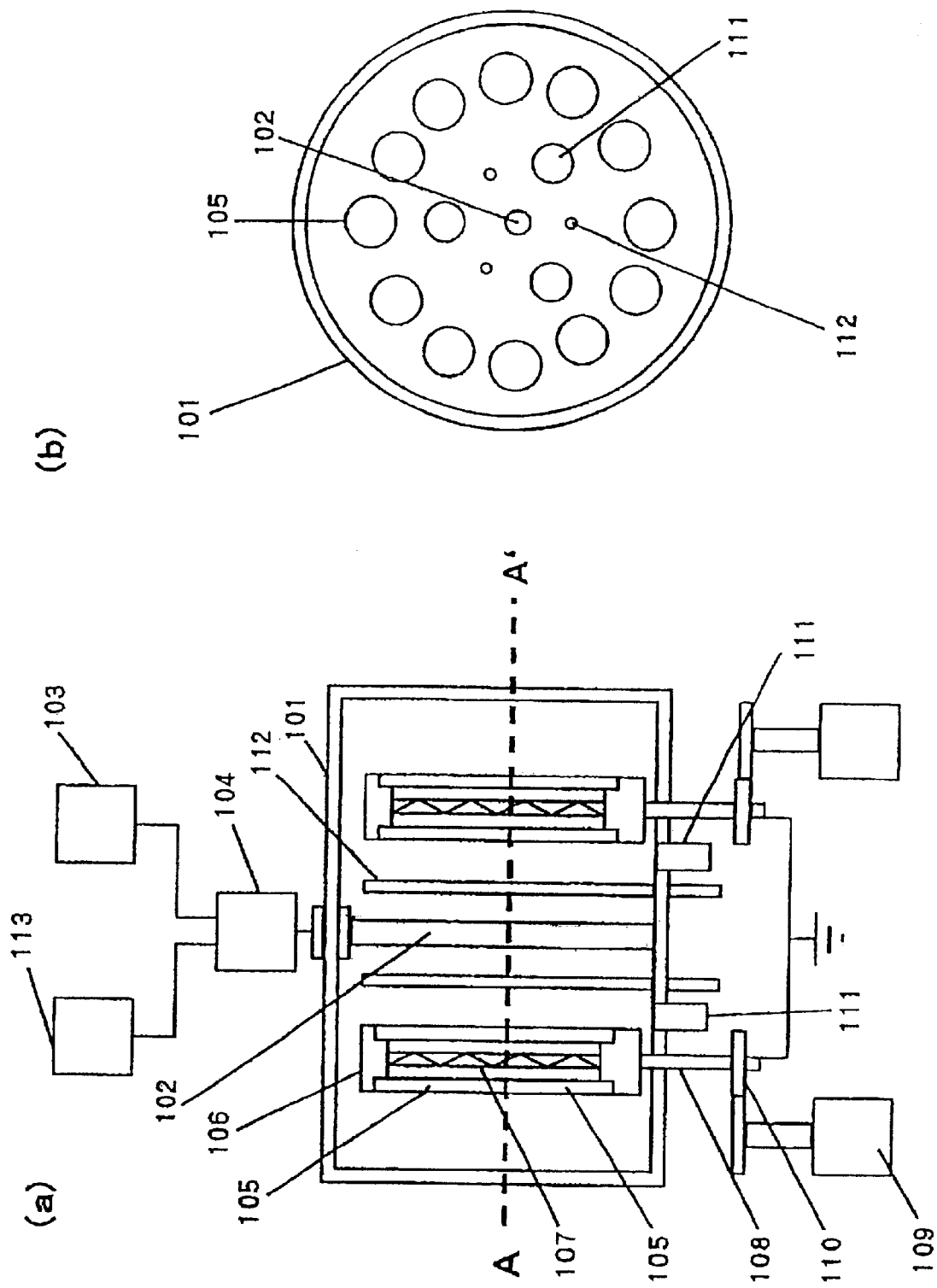
FIGS. 2A and 2B are diagrams showing another deposited film forming apparatus for performing the vacuum processing method of the present invention.

In this embodiment, the amorphous silicon photosensitive members were formed on the conditions shown in Table 5 by using the deposited film forming apparatus shown in FIG. 2A in the case where the oscillation frequency of the high-frequency power supply 103 is 180 MHz and those of the high-frequency power supply 113 are 100 MHz, 120 MHz, 140 MHz and 160 MHz.

The apparatus shown in FIG. 2A has two cylindrical substrates 105 of aluminum of which diameter is 30 mm and length is 358 mm doubly placed in the axial direction of the holder 106. And the twelve holders 106 wherein the two cylindrical substrates 105 are doubly placed in the axial direction are placed equidistantly on the same circumference centered on the high-frequency electrode 102. Each holder 106 is held by the rotation axis 108 capable of rotating via the motor 109 and the reduction gear 110.

The holder 106 used in this embodiment is made of 722-mm long aluminum, and its surface is blast-processed. The cylindrical substrate 105 is mounted between the position of 3 mm from the top end of the holder 106 and the position of 3 mm from the bottom end thereof.

The high-frequency electrode 102 is made of SUS and has the columnar shape of which diameter is 20 mm and configured to be covered by a pipe made of alumina of which internal diameter is 21 mm and external diameter is 24 mm. This pipe made of alumina is blast-processed and its surface roughness is 20 $\mu$m in Rz with reference length of 2.5 mm. In this embodiment, the upper part and the lower part of the high-frequency electrode 102 have a coaxial structure wherein an aluminum cylinder integrally placed on the upper and lower walls of the reaction container 101 is an outer conductor and the high-frequency electrode 102 is an inner conductor. The substantial length of the high-frequency electrode 102 is the length between the upper end and the lower end of the above coaxial structure, which is 60 cm in this embodiment. In addition, the relative positional relationship between the high-frequency electrode 102 and the cylindrical substrate 105 is the same in the upper and lower parts of the above structure.

Moreover, the apparatus shown in FIG. 2A has three exhaust pipes 111 for exhausting the air exhausted from inside the reaction container 101 at the bottom of the reaction container 101. The remaining structure of the apparatus shown in FIG. 2A is the same as the apparatus shown in FIG. 1A.

The high-frequency powers outputted from the high-frequency power supplies 103 and 113 are supplied to the matching box 104 by different coaxial lines respectively, and are admitted into the reaction container 101 from the high-frequency electrode 102 after the respective powers are synthesized in the matching box 104. Moreover, a filter circuit (not shown) is provided in the matching box 104 so that each high-frequency power will not flow into the other high-frequency power supply.

The material gas supply means 112 used here is comprised of the pipe made of alumina of which internal diameter is 10 mm and external diameter is 13 mm with its ends sealed, and configured to be capable of supplying the material gases from the ten exhaust nozzles of which diameter is 1.2 mm provided on the side walls of the pipe. The set location of the material gas supply means 112 is inside the layout circle made by the cylindrical substrates 105, and the three material gas supply means 112 are equidistantly placed on the same circumference having the same center as the layout circle of the cylindrical substrates 105. The surface of the material gas supply means 112 is blast-processed and its surface roughness is 20 $\mu$m in Rz with the reference length of 2.5 mm.

First, the wavelengths of the high-frequency powers in the reaction container 101 thus constituted were measured. To be more specific, the plasma was generated in the reaction container 101 on the photoconductive layer conditions shown in Table 5 except that the output value of the high-frequency power supply 103 was the total output value shown in Table 5 below and that of the high-frequency power supply 113 was 0W. The probe was inserted into the reaction container 101 in the state where the plasma was generated, and the electron temperature at the position of 2 cm from the surfaces of the cylindrical substrate 105 and the holder 106 was measured with 1-cm spacing in the axial direction thereof. The distribution of the electron temperature was thereby obtained as to the axial direction of the cylindrical substrate 105 and the holder 106, and the local drops of the electron temperature were checked with 16.7-cm spacing. Consequently, it was found out that the wavelength of the high-frequency power of 180-MHz frequency in the reaction container 101 was 33.4 cm. The wavelengths of the high-frequency powers of 100-MHz, 120-MHz 140-MHz and 160-MHz frequencies in the reaction container 101 are 60 cm, 50 cm, 43 cm and 38 cm respectively, if calculated based on this consequence.

Next, five lots (total 120 pieces) of the amorphous silicon photosensitive member were formed on each condition by using the same procedure as the first embodiment.

TABLE 5

|  | Charge injection blocking layer | Photoconductive layer | Surface layer |
| --- | --- | --- | --- |
| Gas type and flow rate |  |  |  |
| SiH$_4$ [ml/min (normal)] | 300 | 300 | 20 |
| H$_2$ [ml/min (normal)] | 500 | 1000 |  |
| B$_2$H$_6$ [ppm] | 2000 | 1.2 |  |
| To SiH$_4$ |  |  |  |
| CH$_4$ [ml/min (normal)] |  |  | 50 |
| NO [ml/min (normal)] | 9 |  |  |
| Substrate temperature [° C.] | 250 | 250 | 250 |
| Internal pressure [Pa] | 1.3 | 1.3 | 1.5 |
| High-frequency power supply 103 output [W] | 1425 | 1900 | 1140 |
| High-frequency power supply 113 output [W] | 75 | 100 | 60 |
| Total output [W] | 1500 | 2000 | 1200 |
| Film thickness [$\mu$m] | 3 | 30 | 0.5 |

As opposed to this, as a third example for comparison, the amorphous silicon photosensitive member was formed on the conditions shown in Table 5 just as in this embodiment except that the oscillation frequency of the high-frequency power supply 113 is 13.56 MHz.

The amorphous silicon photosensitive members formed in this embodiment and the third example for comparison were placed on a Canon copying machine NP-6030 remodeled for the testing purposes to evaluate them as to the four items of "image density unevenness," "chargeability," "optical memory" and "image defect" by the concrete evaluation method that is the same as the first embodiment.

The evaluation results are shown in Table 6.

TABLE 6

| Frequency of high-frequency power supply 113 [MHz] | 100 | 120 | 140 | 160 |
|---|---|---|---|---|
| $(\lambda 2 - \lambda 1) \times Ls/\lambda 2$ [cm] | 32.4 | 24.5 | 16.6 | 8.6 |
| $\lambda 2/2$ [cm] | 30.0 | 25.0 | 21.4 | 18.8 |
| $0.9 \times \lambda 2/2$ [cm] | 27.0 | 22.5 | 19.3 | 16.9 |
| Image density unevenness | A | AA to A | AA | AA |
| Chargeability | A to B | A | A | A |
| Optical memory | A to B | A | AA to A | AA to A |
| Image defect | A | AA to A | AA | AA |

In Table 6, the evaluation results in the case where the oscillation frequency of the high-frequency power supply 113 is 13.56 MHz in the third example for comparison are used as the reference, where it is indicated, regarding the image density unevenness, as AA if the maximum reflection density difference improved to less than ¼, AA to A if improved to ¼ to less than ½, A if improved to ½ to less than ¾, A to B if improved to ¾ or more, B if equivalent, and C if deteriorated.

In addition, as for the chargeability, it is indicated as AA if improved by 10 percent or more, AA to A if improved by 5 to less than 10 percent, A if improved by 2.5 to less than 5 percent, and A to B if improved by less than 2.5 percent, B if equivalent, and C if deteriorated.

As for the optical memory, it is indicated as AA if the maximum reflection density difference improved to less than ¼, AA to A if improved to ¼ to less than ½, A if improved to ½ to less than ¾, A to B if improved to ¾ or more, B if equivalent, and C if deteriorated.

As for the image defect, it is indicated as AA if the number of the white dots of 0.1 mm-or-more diameter improved to less than ¼, AA to A if improved to ¼ to less than ½, A if improved to ⅔ to less than ¾, A to B if improved to ¾ or more, B if equivalent, and C if deteriorated.

As seen from Table 6, good results were obtained on all the conditions of this embodiment wherein the oscillation frequencies of the high-frequency power supply 113 are 100 MHz to 160 MHz, that is, on all the conditions of this embodiment satisfying the relation of $0.9 \geq f2/f1 > 0.5$ in the case where the oscillation frequency of the high-frequency power supply 103 is f1 and that of the high-frequency power supply 113 is f2.

Moreover, it was verified that, in the case where the length of the cylindrical substrate 105 (716 mm since two 358-mm long substrates are doubly placed in the axial direction) is Ls, the effects of the present invention were remarkably acquired by satisfying $(\lambda 2 - \lambda 1) \times Ls/\lambda 2 < \lambda 2/2$, and further remarkably acquired by satisfying $(\lambda 2 - \lambda 1) \times Ls/\lambda 2 < 0.9 \times \lambda 2/2$.

In addition, the electrophotographic images formed by using the electrophotographic photosensitive members produced according to this embodiment were very excellent without any image smearing and so on.

Fourth Embodiment

Also in this embodiment, the amorphous silicon photosensitive members comprised of a charge transportation layer, a charge generation layer and the surface layer were formed on the cylindrical substrate 105 made of aluminum of which diameter is 30 mm and length is 358 mm on the conditions shown in Table 7 by using the deposited film forming apparatus shown in FIG. 2A and setting the oscillation frequency of the high-frequency power supply 103 at 210 MHz and that of the high-frequency power supply 113 at 110 MHz. Moreover, the output of the high-frequency power supply 103 is 95 percent of the total output and the output of the high-frequency power supply 113 is 5 percent thereof.

This embodiment has the constitution wherein one cylindrical substrate 105 of which diameter is 30 mm and length is 358 mm is mounted on one holder 106. In addition, the length of the holder 106 has six conditions of 40 cm, 45 cm, 50 cm, 55 cm, 60 cm and 65 cm. The cylindrical substrate 105 is mounted on the holder 106, irrespective of the length of the holder 106, so that the top end of the cylindrical substrate 105 is located at the position of 2 cm from the top end of the holder 106. Accordingly, the distance between the bottom end of the cylindrical substrate 105 and that of the holder 106 becomes 2.2 cm, 7.2 cm, 12.2 cm, 17.2 cm, 22.2 cm and 27.2 cm according to the lengths of the respective conditions of the holder 106, that is, 40 cm, 45 cm, 50 cm, 55 cm, 60 cm and 65 cm. Moreover, the holder 106 is made of aluminum and its surface is blast-processed.

The high-frequency electrode 102 is made of SUS and has the cylindrical shape of which diameter is 20 mm and length is 70 cm, and is constituted to be covered by a pipe made of alumina of which internal diameter is 21 mm and external diameter is 24 mm. The pipe made of alumina is blast-processed and its surface roughness is 20 µm in Rz with the reference length of 2.5 mm.

The high-frequency powers outputted from the high-frequency power supplies 103 and 113 are supplied to the matching box 104 by different coaxial lines respectively, and are admitted into the reaction container 101 from the high-frequency electrode 102 after the respective powers are synthesized in the matching box 104. Moreover, the filter circuit (not shown) is provided in the matching box 104 so that each high-frequency power will not flow into the other high-frequency power supply.

The material gas supply means 112 used here is comprised of the pipe made of alumina of which internal diameter is 10 mm and external diameter is 13 mm with its ends sealed, and constituted to be capable of supplying the material gases from ten exhaust nozzles of which diameter is 1.2 mm provided on side walls of the pipe. The set location of the material gas supply means 112 is inside the layout circle made by the cylindrical substrates 105, and the three material gas supply means 112 are equidistantly placed on the same circumference having the same center as the layout circle of the cylindrical substrates 105. The surface of the material gas supply means 112 is blast-processed and its surface roughness is 20 µm in Rz with the reference length of 2.5 mm.

First, the wavelengths of the high-frequency powers in the reaction container 101 in the apparatus thus constituted were measured. To be more specific, the plasma was generated in the reaction container 101 on the charge generation layer conditions shown in Table 7 except that the output value of the high-frequency power supply 103 was the total output value shown in Table 7 and that of the high-frequency power supply 113 was 0W. The probe was inserted into the reaction container 101 in the state where the plasma was generated, and the electron temperature at the position of 2 cm from the surfaces of the cylindrical substrate 105 and the holder 106 was measured with 1-cm spacing in the axial direction thereof. Thus, the distribution of the electron temperature was obtained in the axial direction of the cylindrical substrate 105 and the holder 106, and local drops of the electron temperature were checked with 14.3-cm spacing. Consequently, it was found out that the wavelength of the high-frequency power of 210-MHz frequency in the reaction container 101 was 28.6 cm. The wavelength of the high-frequency power of 110-MHz frequency in the reaction container 101 is 54.6 cm, if calculated based on this consequence.

Next, five lots (total 30 pieces) of the amorphous silicon photosensitive member were formed in the units of six pieces per lot on each length condition of the holder 106 by using the same procedure as the first embodiment. Additionally, among twelve holders 106, the cylindrical substrate 105 is not mounted on each of six holders.

TABLE 7

|  | Charge transportation layer | Charge generation layer | Surface layer |
| --- | --- | --- | --- |
| Gas type and flow rate |  |  |  |
| SiH$_4$ [ml/min (normal)] | 400 | 200 | 30 |
| H$_2$ [ml/min (normal)] | 1000 | 1000 |  |
| B$_2$H$_6$ [ppm] To SiH$_4$ | 10 → 1.5 | 1.5 |  |
| CH$_4$ [ml/min (normal)] | 600 → 0 |  | 75 |
| Substrate temperature [° C.] | 250 | 250 | 250 |
| Internal pressure [Pa] | 2.1 → 1.3 | 1.3 | 1.5 |
| High-frequency power supply 103 output [W] | 2280 | 1900 | 1140 |
| High-frequency power supply 113 output [W] | 120 | 100 | 60 |
| Total output [W] | 2400 | 2000 | 1200 |
| Film thickness [μm] | 3 | 30 | 0.5 |

As opposed to this, as a fourth example for comparison, the amorphous silicon photosensitive member was formed on the conditions shown in Table 7 just as in this embodiment except that the oscillation frequency of the high-frequency power supply 113 is 10 MHz.

The amorphous silicon photosensitive members formed according to this embodiment and the fourth example for comparison were placed on the Canon copying machine NP-6030 remodeled for the testing purposes to evaluate them as to the four items of "image density unevenness," "chargeability," "optical memory" and "image defect" by the concrete evaluation method that is the same as the first embodiment.

The evaluation results are shown in Table 8.

TABLE 8

| Length of holder 106 [cm] | 40 | 45 | 50 | 55 | 60 | 65 |
| --- | --- | --- | --- | --- | --- | --- |
| (λ2 − λ1) × Lh/λ2 [cm] | 19.0 | 21.4 | 23.8 | 26.2 | 28.6 | 31.0 |
| λ2/2 [cm] | 27.3 | 27.3 | 27.3 | 27.3 | 27.3 | 27.3 |
| 0.9 × λ2/2 [cm] | 24.5 | 24.5 | 24.5 | 24.5 | 24.5 | 24.5 |

TABLE 8-continued

| Length of holder 106 [cm] | 40 | 45 | 50 | 55 | 60 | 65 |
| --- | --- | --- | --- | --- | --- | --- |
| Image density unevenness | AA | AA | AA | AA to A | A | A |
| Chargeability | AA to A | AA to A | AA to A | A | A to B | A to B |
| Optical memory | AA to A | AA to A | AA to A | A | A to B | A to B |
| Image defect | AA | AA | AA | AA to A | A to B | A to B |

In Table 8, the evaluation results in the case where the oscillation frequency of the high-frequency power supply 113 is 10 MHz in the fourth example for comparison are used as the reference, where it is indicated, regarding the image density unevenness, as AA if the maximum reflection density difference improved to less than ¼, AA to A if improved to ¼ to less than ½, A if improved to ½ to less than ¾, A to B if improved to ¾ or more, B if equivalent, and C if deteriorated.

In addition, as for the chargeability, it is indicated as AA if improved by 10 percent or more, AA to A if improved by 5 to less than 10 percent, A if improved by 2.5 to less than 5 percent, and A to B if improved by less than 2.5 percent, B if equivalent, and C if deteriorated.

As for the optical memory, it is indicated as AA if the maximum reflection density difference improved to less than ¼, AA to A if improved to ¼ to less than ½, A if improved to ½ to less than ¾, A to B if improved to ¾ or more, B if equivalent, and C if deteriorated.

As for the image defect, it is indicated as AA if the number of the white dots of 0.1 mm-or-more diameter improved to less than ¼, AA to A if improved to ¼ to less than ½, A if improved to ⅔ to less than ¾, A to B if improved to ¾ or more, B if equivalent, and C if deteriorated.

As seen from Table 8, good results were obtained on all the conditions compared with the fourth example for comparison. Moreover, it was verified that, in the case where the holder length is Lh, the effects of the present invention were remarkably acquired by satisfying (λ2−λ1)×Lh/λ2<λ2/2, and further remarkably acquired by satisfying (λ2−λ1)×Lh/λ2<0.9×λ2/2.

In addition, the electrophotographic images formed by using the electrophotographic photosensitive members produced according to this embodiment were very excellent without any image smearing and so on.

Fifth Embodiment

Figure 3:
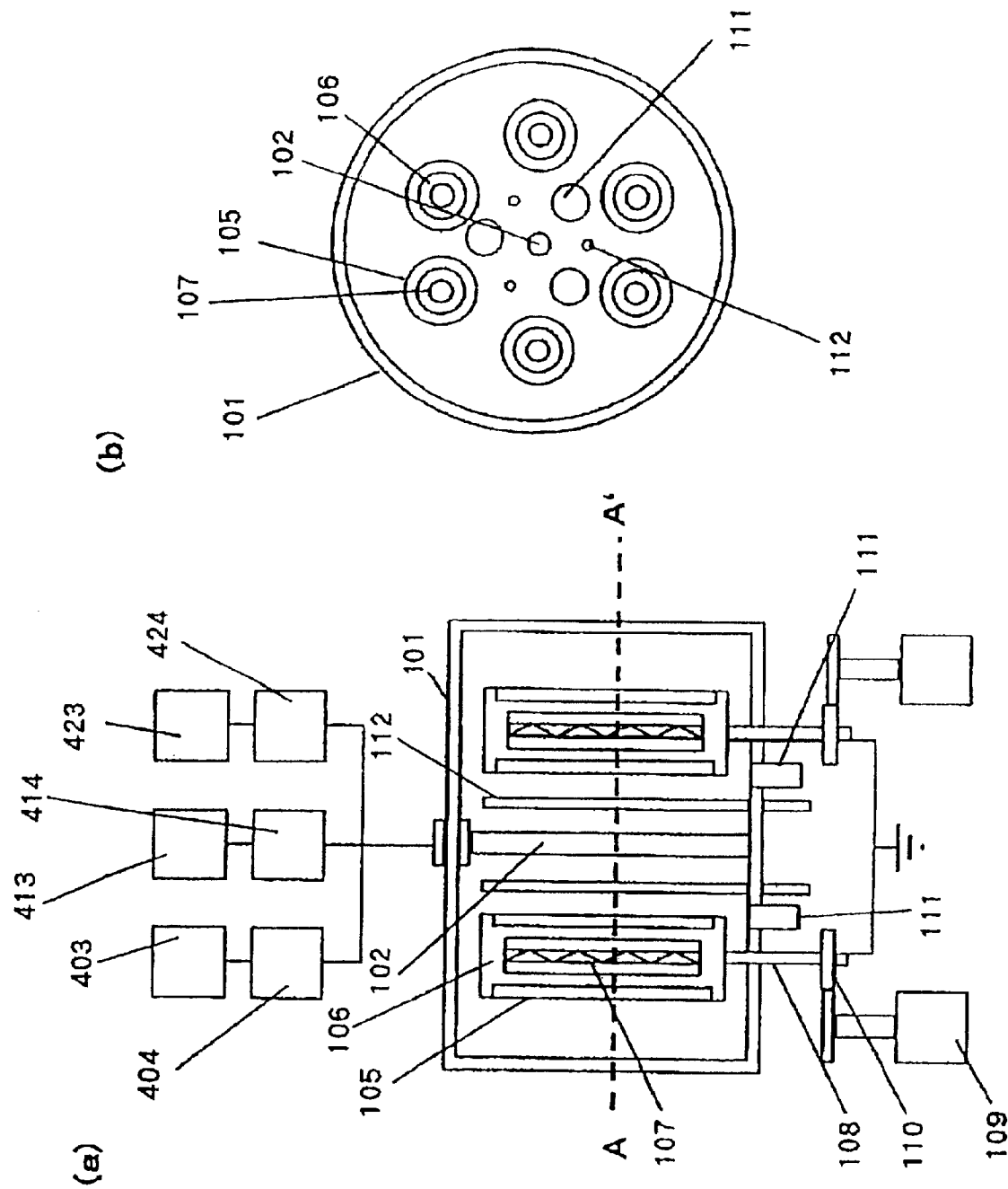
FIGS. 3A and 3B are diagrams showing a further deposited film forming apparatus for performing the vacuum processing method of the present invention.
Figure 4:
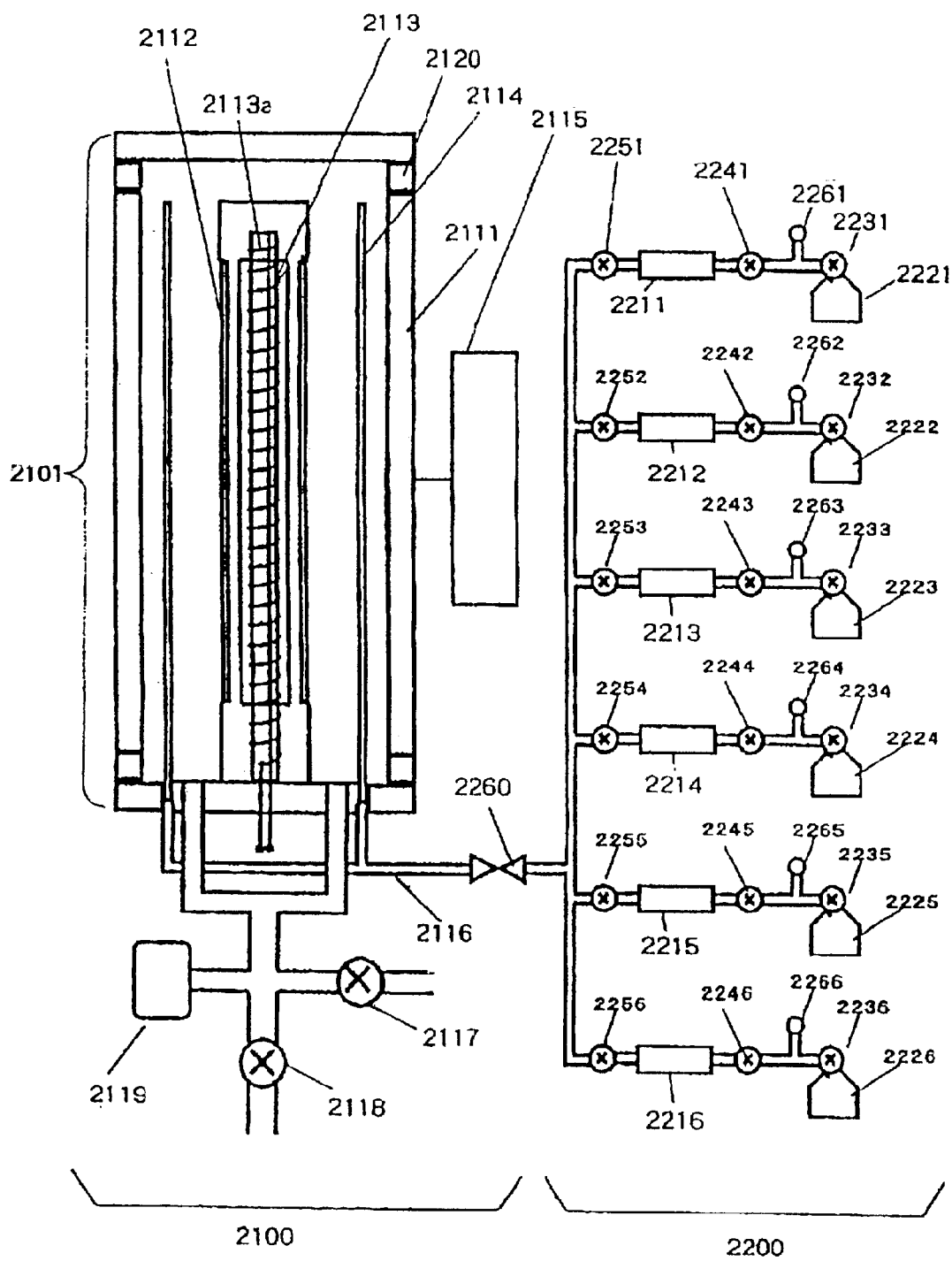
FIG. 4 is a diagram showing an example of a conventional deposited film forming apparatus.
Figure 5:
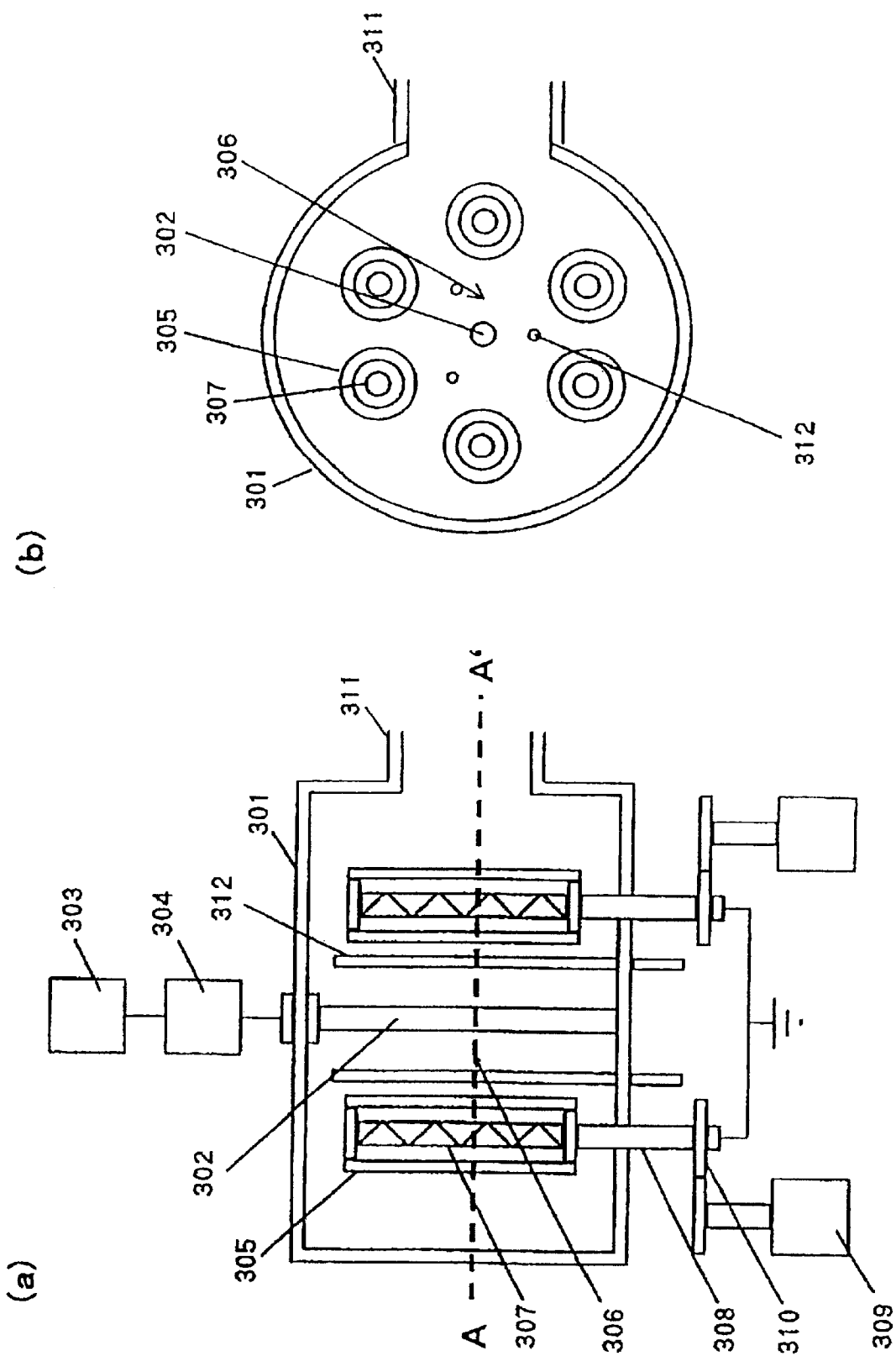
FIGS. 5A and 5B are diagrams showing another example of the conventional deposited film forming apparatus.

In this embodiment, the amorphous silicon photosensitive members comprised of the charge injection blocking layer, the photoconductive layer and the surface layer were formed on the cylindrical substrate 105 made of aluminum of which diameter is 108 mm and length is 358 mm on the conditions shown in Table 9 by using the deposited film forming apparatus shown in FIG. 3A.

The apparatus shown in FIG. 3A has three high-frequency power supplies 403, 413 and 423 and matching boxes 404, 414 and 424 for the respective high-frequency power supplies. The remaining constitution of the apparatus shown in FIG. 3A is the same as the apparatus shown in FIG. 1A except that of the exhaust pipe 111. The apparatus shown in FIG. 3A has three exhaust pipes 111 placed at the bottom of the reaction container 101 in order to exhaust the air from therein.

The high-frequency powers outputted from the high-frequency power supplies 403, 413 and 423 respectively are admitted into the reaction container 101 from the high-frequency electrode 102 after going through the matching boxes 404, 414 and 424 to be mutually synthesized. Moreover, the filter circuit (not shown) is provided in each of the matching boxes 404, 414 and 424 so that other high-frequency powers will not flow into each high-frequency power supply.

In this embodiment, the frequency of the high-frequency power outputted from the high-frequency power supply 403 is 105 MHz, that outputted from the high-frequency power supply 413 is 80 MHz, and that outputted from the high-frequency power supply 423 is 60 MHz. The holder 106 is made of 50-cm long aluminum, and its surface is blast-processed.

The high-frequency electrode 102 is made of SUS and has the cylindrical shape of which diameter is 20 mm and length is 60 cm, and is constituted to be covered by the pipe made of alumina of which internal diameter is 21 mm and external diameter is 24 mm. The pipe made of alumina is blast-processed and the surface roughness of this pipe is 20 μm in Rz with the reference length of 2.5 mm.

The material gas supply means 112 used here is comprised of the pipe made of alumina of which internal diameter is 10 mm and external diameter is 13 mm with its ends sealed, and constituted to be capable of supplying the material gases from ten exhaust nozzles of which diameter is 1.2 mm provided on side walls of the pipe. The set location of the material gas supply means 112 is inside the layout circle made by the cylindrical substrates 105 and the three material gas supply means 112 are equidistantly placed on the same circumference having the same center as the layout circle of the cylindrical substrates 105. The surface of the material gas supply means 112 is blast-processed and its surface roughness is 20 μm in Rz with the reference length of 2.5 mm.

The photosensitive members were formed by using the apparatus having the above constitution according to the following procedure.

First, the cylindrical substrates 105 held on the substrate holders 106 were placed on the rotation axes 108 in the reaction container 101. Thereafter, the air was exhausted from inside the reaction container 101 through the exhaust pipe 111 by the exhauster that is not shown. Subsequently, the cylindrical substrates 105 were rotated by the motor 109 via the rotation axes 108 at the speed of 10 rpm, and further the cylindrical substrates 105 were heated and controlled to be 250° C. by the heating element 107 while supplying the Ar gas of which flow rate is 500 ml/min (normal) into the reaction container 101 from the material gas supply means 112, and that state was maintained for two hours.

Next, the supply of the Ar gas was stopped and the air was exhausted from inside the reaction container 101 through the exhaust pipe 111 by the exhauster that is not shown, and then the material gases to be used for forming the charge injection blocking layer were admitted on the conditions shown in the Table 9 below via the material gas supply means 112. After checking that the flow rates of the material gases became the set flow rates and the pressure in the reaction container 101 became stable, the high-frequency powers were supplied to the high-frequency electrode 102 via the matching boxes 404, 414 and 424 by setting the outputs of the high-frequency power supplies 403, 413 and 423 at the predetermined values respectively. The charge injection blocking layer was formed on the cylindrical substrates 105 by dissociating the material gases by excitation with the high-frequency powers radiated into the reaction container 101 from the high-frequency electrode 102. After the predetermined film thickness was formed, discharge was not stopped in this embodiment but the setting was changed by successively changing the gas flow rate and electric power to a condition for forming the first photoconductive layer that is the next layer. In this case, the time for successively changing the gas flow rate and electric power was ten minutes. After the first photoconductive layer of the predetermined film thickness was formed, the setting was changed to a condition for forming the second photoconductive layer that is the next layer by successively changing the gas flow rate. In this case, the time for successively changing the gas flow rate and electric power was five minutes. After the second photoconductive layer of the predetermined film thickness was formed, the setting was changed to a condition for forming the surface layer that is the next layer by successively changing the gas flow rate, electric power and pressure. In this case, the time for successively changing the gas flow rate and electric power was fifteen minutes. And the surface layer of the predetermined film thickness was formed.

TABLE 9

|  | Photoconductive layer | | | |
|---|---|---|---|---|
|  | Charge injection blocking layer | First photo-conductive layer | Second photo-conductive layer | Surface layer |
| Gas type and flow rate | | | | |
| SiH$_4$ [ml/min (normal)] | 200 | 200 | 200 | 20 |
| H$_2$ [ml/min (normal)] | 200 | 600 | 600 | |
| B$_2$H$_6$ [ppm] To SiH$_4$ | 1000 | 2.5 | 0 | |
| CH$_4$ [ml/min (normal)] | | | | 50 |
| NO [ml/min (normal)] | 10 | | | |
| Substrate temperature [° C.] | 250 | 250 | 250 | 250 |
| Internal pressure [Pa] | 1.3 | 1.3 | 1.3 | 1.5 |
| High-frequency power supply 403 output [W] | 810 | 1620 | 1440 | 630 |
| High-frequency power supply 413 output [W] | 45 | 90 | 90 | 35 |
| High-frequency power supply 423 output [W] | 45 | 90 | 90 | 35 |
| High-frequency power supply total output [W] | 900 | 1800 | 1620 | 700 |
| Film thickness [μm] | 3 | 27 | 3 | 0.5 |

As opposed to this, as a fifth example for comparison, the amorphous silicon photosensitive member was formed on the conditions shown in Table 9 just as in this embodiment except that the high-frequency power is only outputted from the high-frequency power supply 403 and not from the high-frequency power supplies 413 and 423. Moreover, in this example for comparison, the output value from the high-frequency power supply 403 was set to be equal to the sum of the output values from the high-frequency power supplies 403, 413 and 423, that is, the total output in this embodiment.

The amorphous silicon photosensitive members formed according to this embodiment and the fifth example for comparison were placed on the Canon copying machine GP-605 remodeled for the testing purposes to evaluate them as to the four items of "image density unevenness," "chargeability," "optical memory" and "image defect" by the concrete evaluation method that is the same as the first embodiment.

The evaluation results are shown in Table 10.

TABLE 10

|  | Image density unevenness | Chargeability | Optical memory | Image defect |
|---|---|---|---|---|
| Fifth embodiment | AA | AA | AA | AA |

In Table 10, the evaluation results in the fifth example for comparison are used as the reference, where it is indicated, regarding the image density unevenness, as AA if the maximum reflection density difference improved to less than ¼, AA to A if improved to ¼ to less than ½, A if improved to ½ to less than ¾, A to B if improved to ¾ or more, B if equivalent, and C if deteriorated.

In addition, as for the chargeability, it is indicated as AA if improved by 10 percent or more, AA to A if improved by 5 to less than 10 percent, A if improved by 2.5 to less than 5 percent, and A to B if improved by less than 2.5 percent, B if equivalent, and C if deteriorated.

As for the optical memory, it is indicated as AA if the maximum reflection density difference improved to less than ¼, AA to A if improved to ¼ to less than ½, A if improved to ½ to less than ¾, A to B if improved to ¾ or more, B if equivalent, and C if deteriorated.

As for the image defect, it is indicated as AA if the number of the white dots of 0.1 mm-or-more diameter improved to less than ¼, AA to A if improved to ¼ to less than ½, A if improved to ⅔ to less than ¾, A to B if improved to ¾ or more, B if equivalent, and C if deteriorated.

As seen from Table 10, the amorphous silicon photosensitive members produced according to this embodiment were better than the photosensitive members produced in the fifth example for comparison in all the items of "image density unevenness," "chargeability," "optical memory" and "image defect," so that the effects of the present invention were verified.

In addition, the electrophotographic images formed by using the electrophotographic photosensitive members produced according to this embodiment were very excellent without any image smearing and so on.

As described above, the vacuum processing method of the present invention is at least using the high-frequency power having f1 and that having f2 satisfying the following two conditions as the high-frequency powers having mutually different frequencies to be simultaneously supplied to the same high-frequency electrode, so that improvement in the vacuum processing characteristics is accomplished while keeping the vacuum processing speed high, and in addition, the uniformity of the vacuum processing characteristics can be rendered very high-level:

$$250\ MHz \geq f1 > f2 \geq 10\ MHz$$

$$0.9 \geq f2/f1 \geq 0.1.$$

Moreover, as it can effectively control the adhesion of foreign matter onto the surface of the article to be processed, it is possible to improve the conforming rate and reduce the vacuum processing costs.

What is claimed is:

1. A vacuum processing method, comprising placing an article to be processed in a reaction container and simultaneously supplying at least two high-frequency powers having mutually different frequencies to the same high-frequency electrode to generate plasma in said reaction container by the high-frequency powers admitted into said reaction container from the high-frequency electrode so as to process said article to be processed, wherein at least the high-frequency power having a frequency f1 and the high-frequency power having a frequency f2 are used and satisfy the following two conditions as said high-frequency powers:

$$250\ MHz \geq f1 > f2 \geq 30\ MHz$$

$$0.9 \geq f2/f1 \geq 0.1.$$

2. The vacuum processing method according to claim 1, wherein said frequency f1 and frequency f2 satisfy a condition of $0.9 \geq f2/f1 > 0.5$.

3. The vacuum processing method according to claim 1, wherein the following condition is satisfied when a length of the longest portion of said high-frequency electrode is Le, a wavelength of a high-frequency power having the highest frequency of said high-frequency powers in said reaction container is λ1, and a wavelength of a high-frequency power having the lowest frequency of said high-frequency powers in said reaction is λ2:

$$(\lambda 2 - \lambda 1) \times Le/\lambda 2 < \lambda 2/2.$$

4. The vacuum processing method according to claim 3, wherein said Le, said λ1 and said λ2 further satisfy a condition of $$(\lambda 2 - \lambda 1) \times Le/\lambda 2 < 0.9 \times \lambda 2/2.$$

5. The vacuum processing method according to claim 1, wherein the following condition is satisfied when a length of the longest portion of a conductive portion of said article to be processed is Ls, a wavelength of a high-frequency power having the highest frequency of said high-frequency powers in said reaction container is λ1, and a wavelength of a high-frequency power having the lowest frequency of said high-frequency powers in said reaction is λ2:

$$(\lambda 2 - \lambda 1) \times Ls/\lambda 2 < \lambda 2/2.$$

6. The vacuum processing method according to claim 5, wherein said Ls, said λ1 and said λ2 further satisfy the condition of $$(\lambda 2 - \lambda 1) \times Ls/\lambda 2 < 0.9 \times \lambda 2/2.$$

7. The vacuum processing method according to claim 1, wherein the following condition is satisfied when said article to be processed is placed on a holder partially comprised of a conductive member and a length of the longest portion of a conductive portion of said holder is Lh, a wavelength of the high-frequency power having a highest frequency of said high-frequency powers in said reaction container is λ1, and a wavelength of a high-frequency power having the lowest frequency of said high-frequency powers in said reaction container is λ2:

$$(\lambda 2 - \lambda 1) \times Lh/\lambda 2 < \lambda 2/2.$$

8. The vacuum processing method according to claim 7, wherein said Lh, said λ1 and said λ2 further satisfy a condition of $$(\lambda 2 - \lambda 1) \times Lh/\lambda 2 < 0.9 \times \lambda 2/2.$$

9. The vacuum processing method according to claim 1, wherein said high-frequency electrode is rod-shaped.

10. The vacuum processing method according to claim 1, including employing a plurality of high-frequency electrodes to generate plasma.

11. The vacuum processing method according to claim 1, wherein said article to be processed is formed in a cylindrical or columnar shape.

12. The vacuum processing method according to claim 1, wherein a deposited film is formed on a surface of said article to be processed.

13. The vacuum processing method according to claim 1, wherein the deposited film for an electrophotographic photosensitive member is formed on a surface of said article to be processed.

14. The vacuum processing method according to claim 1, wherein said frequency f2 satisfies a condition of 90 MHz$\geq$f2$\geq$50 MHz.

* * * * *